United States Patent
Reuveni

(10) Patent No.: US 7,016,447 B1
(45) Date of Patent: Mar. 21, 2006

(54) DIGITAL CLOCK RECOVERY PLL

(75) Inventor: David R. Reuveni, Taufkirchen (DE)

(73) Assignee: LSI Logic Corporation, Milpitas, CA (US)

( * ) Notice: Subject to any disclaimer, the term of this patent is extended or adjusted under 35 U.S.C. 154(b) by 932 days.

(21) Appl. No.: 09/822,041

(22) Filed: Mar. 30, 2001

Related U.S. Application Data

(60) Provisional application No. 60/218,574, filed on Jul. 17, 2000.

(51) Int. Cl.
*H04L 7/00* (2006.01)

(52) U.S. Cl. .................. 375/371; 375/326; 370/518; 327/144

(58) Field of Classification Search ........... 375/326, 375/327, 371, 373, 376; 370/516, 518; 327/144, 327/146, 147
See application file for complete search history.

(56) References Cited

U.S. PATENT DOCUMENTS

| | | | | |
|---|---|---|---|---|
| 5,127,023 A | * | 6/1992 | Tash et al. ............... | 375/282 |
| 5,509,037 A | * | 4/1996 | Buckner et al. ........... | 375/371 |
| 5,850,422 A | * | 12/1998 | Chen ...................... | 375/371 |
| 5,887,040 A | * | 3/1999 | Jung et al. ............... | 375/372 |
| 6,031,886 A | * | 2/2000 | Nah et al. ................ | 375/375 |
| 6,266,799 B1 | * | 7/2001 | Lee et al. ................. | 716/6 |
| 6,417,698 B1 | * | 7/2002 | Williams et al. .......... | 326/93 |

OTHER PUBLICATIONS

David R. Reuveni, "Digital Clock Recovery PLL", U.S. Appl. No. 09/822,112, filed Mar. 30, 2001.
David R. Reuveni, "Digital Clock Recovery PLL", U.S. Appl. No. 09/821,886, filed Mar. 30, 2001.

* cited by examiner

*Primary Examiner*—Young T. Tse
(74) *Attorney, Agent, or Firm*—Christopher P. Maiorana, P.C.

(57) ABSTRACT

An apparatus comprising an analog circuit and a digital circuit. The analog circuit may be configured to generate a plurality of samples of an input signal in response to a plurality of phases of a reference clock. The digital circuit may be configured to generate an output signal and a clock signal in response to the plurality of samples and the plurality of phases. The clock signal is generally aligned with the output signal.

21 Claims, 14 Drawing Sheets

# DIGITAL CLOCK RECOVERY PLL

This application claims the benefit of U.S. Provisional Application No. 60/218,574, filed Jul. 17, 2000, and is hereby incorporated by reference in its entirety.

CROSS-REFERENCE TO RELATED APPLICATIONS

The present invention may relate to co-pending applications U.S. Ser. No. 09/822,112 and U.S. Ser. No. 09/821,886, filed Mar. 30, 2001, which are each hereby incorporated by reference in their entirety.

FIELD OF THE INVENTION

The present invention relates to a method and/or architecture for clock and data recovery using a phase locked loop (PLL) generally and, more particularly, to a digital clock recovery phase locked loop (DCRPLL).

BACKGROUND OF THE INVENTION

Conventional clock and data recovery systems use a phase locked loop circuit to extract a clock and/or data signal from a serial data stream. The serial data stream may be derived from a number of sources. One such source is a recordable medium, such as a compact disc (CD) or digital video disk (DVD). However, such sources may be subject to periods of data drop out due to issues such as scratches in the disk. During such periods of data loss, conventional data recovery circuits can loose the acquisition of the clock signal, which, depending on the length of the data drop out, may not be recoverable.

It would be desirable to implement a clock and data recovery circuit that is less prone to problems associated with retaining a lock during a data drop out condition.

SUMMARY OF THE INVENTION

The present invention concerns an apparatus comprising an analog circuit and a digital circuit. The analog circuit may be configured to generate a plurality of samples of an input signal in response to a plurality of phases of a reference clock. The digital circuit may be configured to generate an output signal and a clock signal in response to the plurality of samples and the plurality of phases. The clock signal is generally aligned with the output signal.

The objects, features and advantages of the present invention include providing a method and/or architecture for implementing a digital clock recovery phase locked loop (DCRPLL) that may (i) use a scoring system to (a) determine length values of valid symbols, (b) determine a read channel data rate based solely on the shortest (e.g., most common) symbols in the data stream, (c) acquire new values and dispense with out-of-date values, (d) determine if a locked state has been reached and/or (e) determine bit width and asymmetry between high and low symbols; (ii) use a system level parameter to set the minimum symbol data width to reduce analysis overhead; (iii) accumulate entries to track gradual changes in the width of a bit; (iv) use an error scoring system to restart the system if an abundance of errors occurs, (v) use an established bit width to (a) generate an output clock, (b) determine a number of bits in a symbol, (c) reformat a symbol length into a number representing a particular number of bits in a symbol, (d) generate a packed form of output data, (e) provide noise suppression, (f) provide scratch detection and/or (g) set minimum symbol length or number of bits for a valid symbol; (vi) generate a serial output clock of arbitrary frequency based on a number of phases; (vii) use a serial output clock to generate serial output data from the symbol data; (viii) generate symbol data; (ix) generate an output value representing the number of bits in a symbol; (x) provide packed output data as a representation of serial data; (xi) provide word alignment and synchronization of payload data; and/or (xii) maintain lock with scratched media.

BRIEF DESCRIPTION OF THE DRAWINGS

These and other objects, features and advantages of the present invention will be apparent from the following detailed description and the appended claims and drawings in which:

DETAILED DESCRIPTION OF THE PREFERRED EMBODIMENTS

Figure 1:
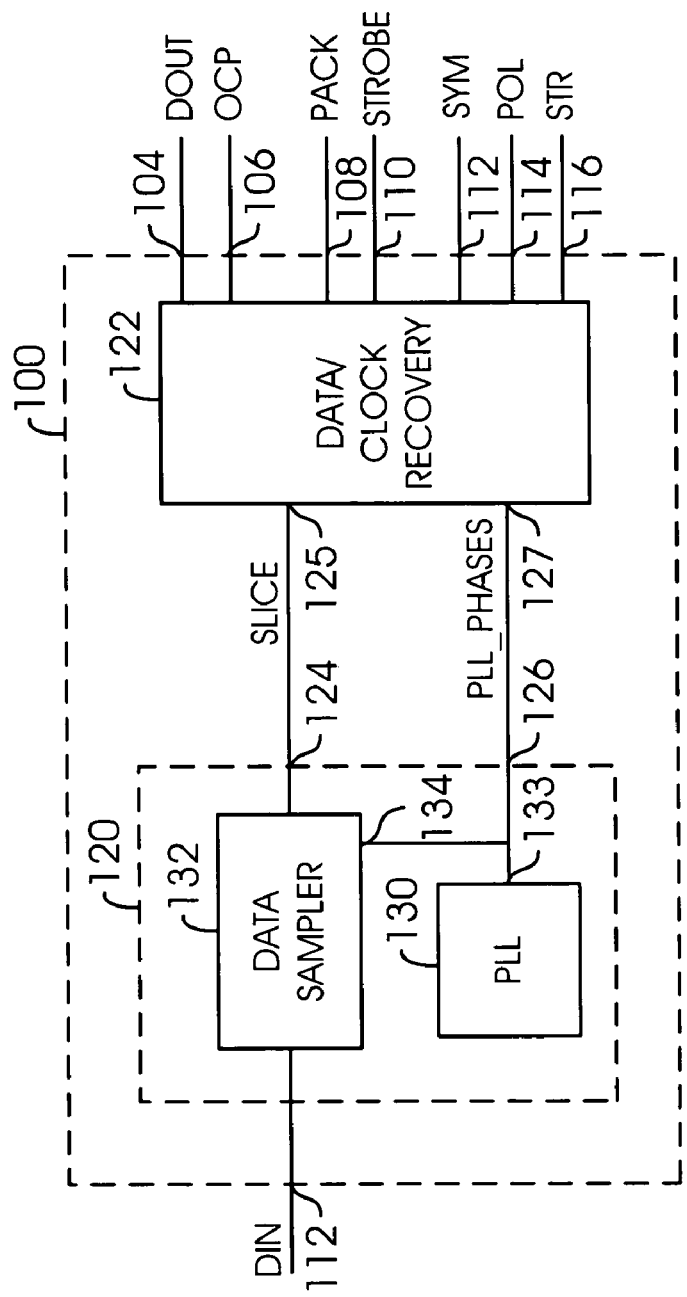
FIG. 1 is a block diagram of a preferred embodiment of the present invention.

Referring to FIG. 1, a block diagram of a circuit 100 is shown in accordance with a preferred embodiment of the present invention. The circuit 100 may be implemented as a Digital Clock Recovery Phase Locked Loop (DCRPLL) circuit. The DCRPLL 100 may be a replacement for an Analog Clock Recovery Phase Locked Loop circuit (e.g., a very complex analog circuit used to extract clock and data information from a read channel data stream). The present invention may use digital logic to achieve the same functionality as provided by analog circuits. Therefore, the present invention may be implemented with modern technology, which expects reproducible, dependable performance when many different functions are integrated onto a single silicon integrated circuit.

The circuit 100 may have an input 102 that may receive a signal (e.g., DIN) and one or more of (i) a set of outputs 104 and 106 that may present serial data signals (e.g., DOUT and OCP), (ii) a set of outputs 108 and 110 that may present packed data signals (e.g., PACK and STROBE), and (iii) a set of outputs 112, 114 and 116 that may present symbol data (e.g., SYM, POL, and STR). However, the circuit 100 may be implemented with other numbers or combinations of output types to meet the design criteria of a particular application.

Figure 5:
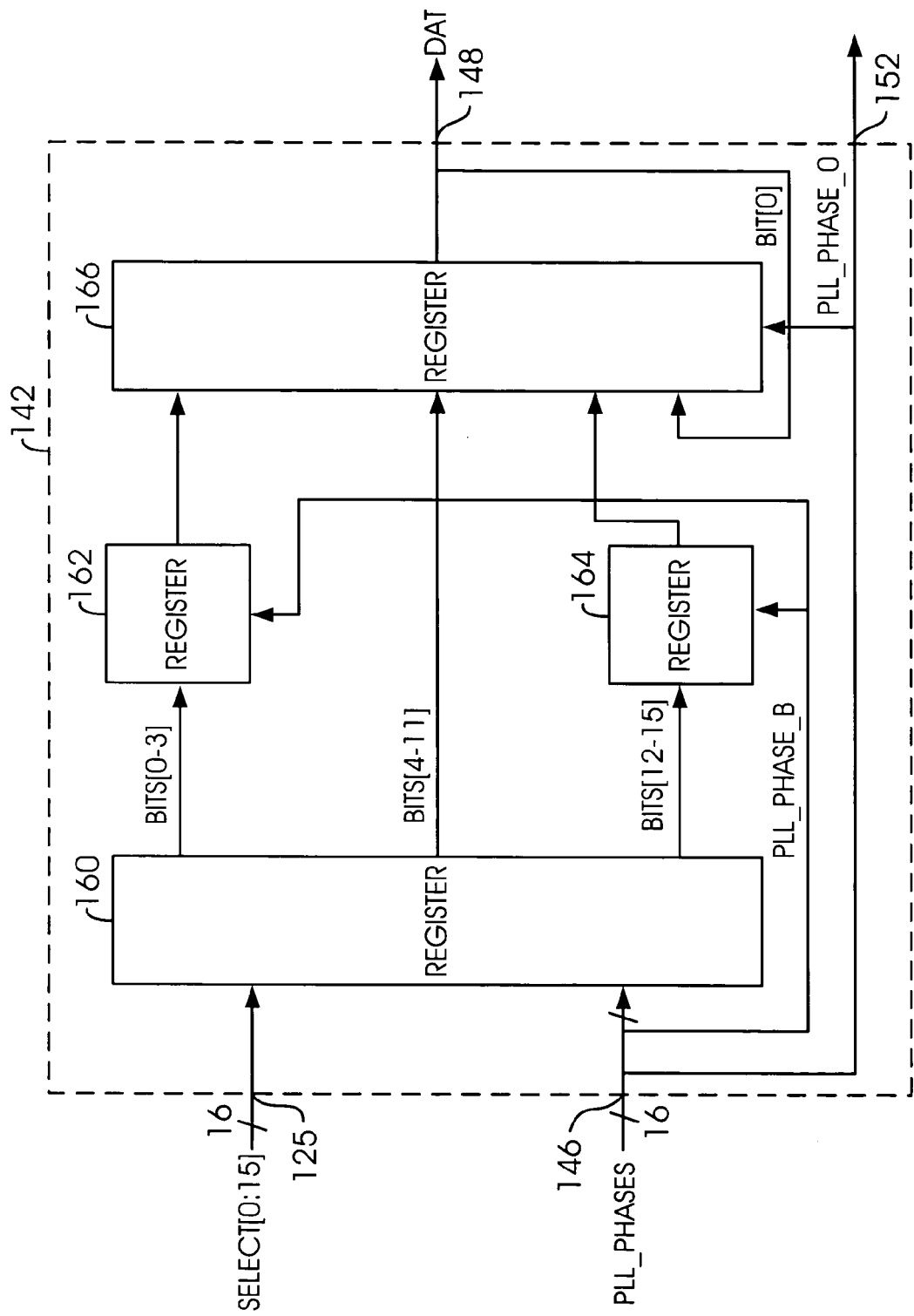
FIG. 5 is a block diagram of a data sample synchronization circuit of FIG. 4.

The circuit 100 generally comprises a circuit 120 and a circuit 122. In one example, the circuit 120 may comprise an analog block (or circuit) and the circuit 122 may comprise a digital block (or circuit). The circuit 120 may have an output 124 that may present a number of data signals (e.g., SLICE) to an input 125 of the circuit 122 and an output 126 that may present a number of clock signals (e.g., PLL_PHASES) to an input 127 of the circuit 122. The signals SLICE may comprise a number of logic levels generated by sampling the signal DIN with the signals PLL_PHASES. The number of samples may correspond to the number of phases. In one example, the signal PLL_PHASE may comprise 16 phases of a reference clock and the signal SLICE may comprise 16 logic level samples of the signal DIN. The 16 logic level samples (e.g., the signal SLICE) from the circuit 120 may be clocked into the circuit 122, each by a respective PLL phase. The circuit 122 may be configured to collate the registered samples into a single clock domain. In one example, the collation may be implemented as a two-step process (described in more detail in connection with FIG. 5).

The circuit 120 may comprise a circuit 130 and a circuit 132. The circuit 130 may be implemented as a multi-phase phase lock loop (PLL) circuit. The circuit 132 may be implemented as a data sampler circuit (or block). The circuit 130 may be configured to generate the clock signal PLL_PHASES comprising a number of different phases (e.g., PLL_PHASE_0–PLL_PHASE_N). The signals PLL_PHASE_0–PLL_PHASE_N may be collectively referred to as the signal PLL_PHASES. The circuit 130 may have an output 133 that may present the signal PLL_PHASES to an input 134 of the circuit 132 and the input 127 of the circuit 122.

In one example, the circuit 130 may be implemented as a 16-phase PLL. However, other numbers of phases may be implemented to meet the design criteria of a particular application. The circuit 130 may be implemented on the same integrated circuit as the data sample circuit 132 and the data/clock recovery circuit (or block) 122. Alternatively, the circuit 120 may be implemented as an external clock source (e.g., as a separate integrated circuit).

The circuit 132 may have an input that may receive the signal DIN and an output that may present the signal SLICE. The signal SLICE may be generated in response to the signals DIN and PLL_PHASES. The circuit 132 may comprise an analog cell having a number of samplers. In one example, the number of samplers may be 16. However, other numbers of samplers may be implemented accordingly to meet the design criteria of a particular application. For example, the number of samplers will generally be the same as the number of phases or a sub-multiple thereof (e.g., 32 phases and 4 samplers). In general, the number of samplers would exceed the number of phases only when redundancy is desirable.

Each sampler of the circuit 132 may be driven by a separate phase from the PLL 130. Each sampler may be implemented, in one example, as a combined sample and hold gate and a comparator circuit (discussed in more detail in connection with FIG. 3). The samplers may provide a logic level output indicating whether a momentary analog input amplitude of signal DIN is greater than or less than a switching threshold of the comparator. Such a sample and comparator circuit is generally also known as a slicer.

Figure 2:
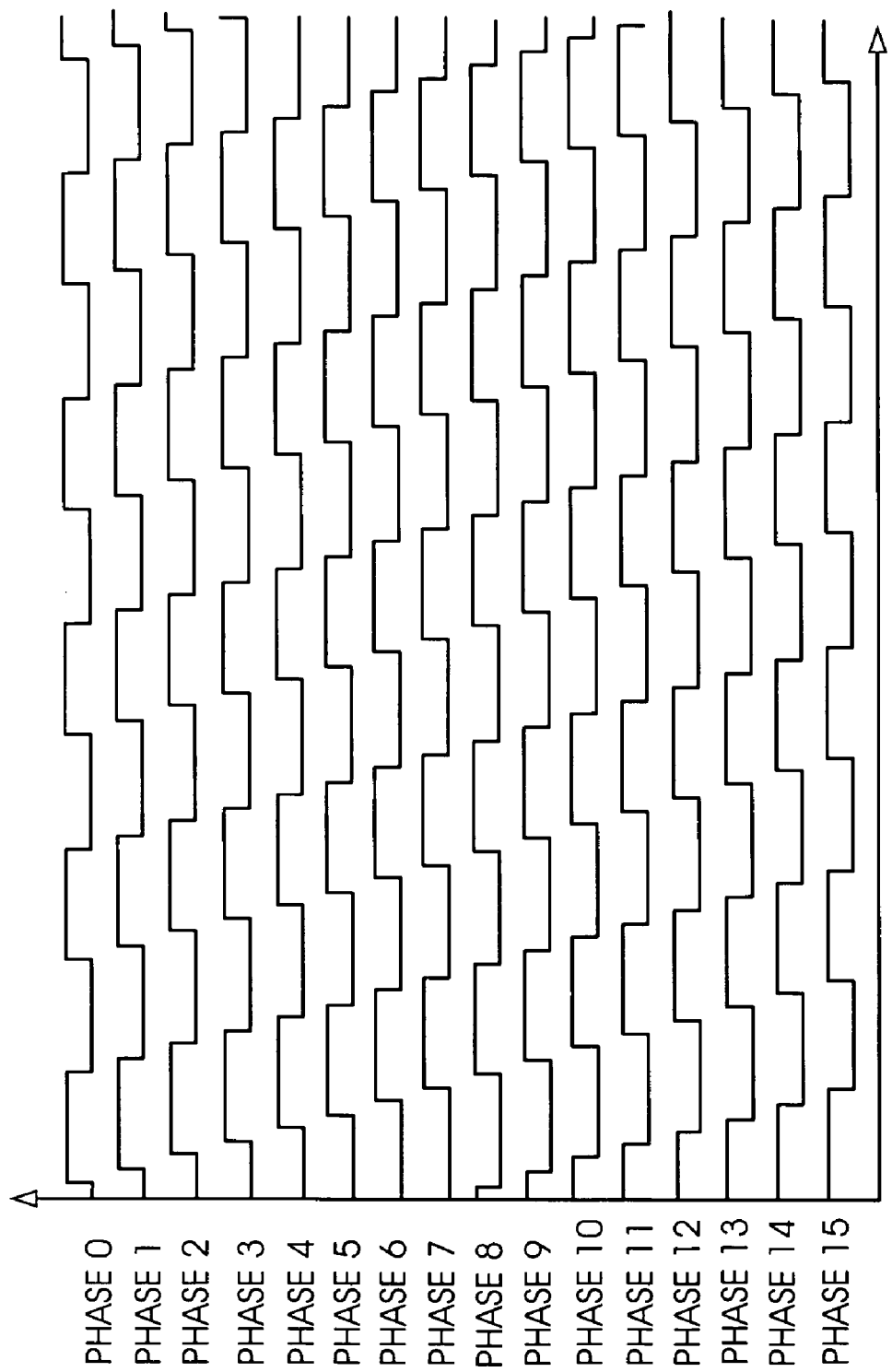
FIG. 2 is a timing diagram illustrating example waveforms of a phase locked loop circuit of FIG. 1.

Referring to FIG. 2, a timing diagram illustrating various waveforms of the circuit 130 is shown. In one example, the circuit 130 may be implemented with 16 phases. However, other numbers of phases may be implemented accordingly to meet the design criteria of a particular implementation.

Figure 3:
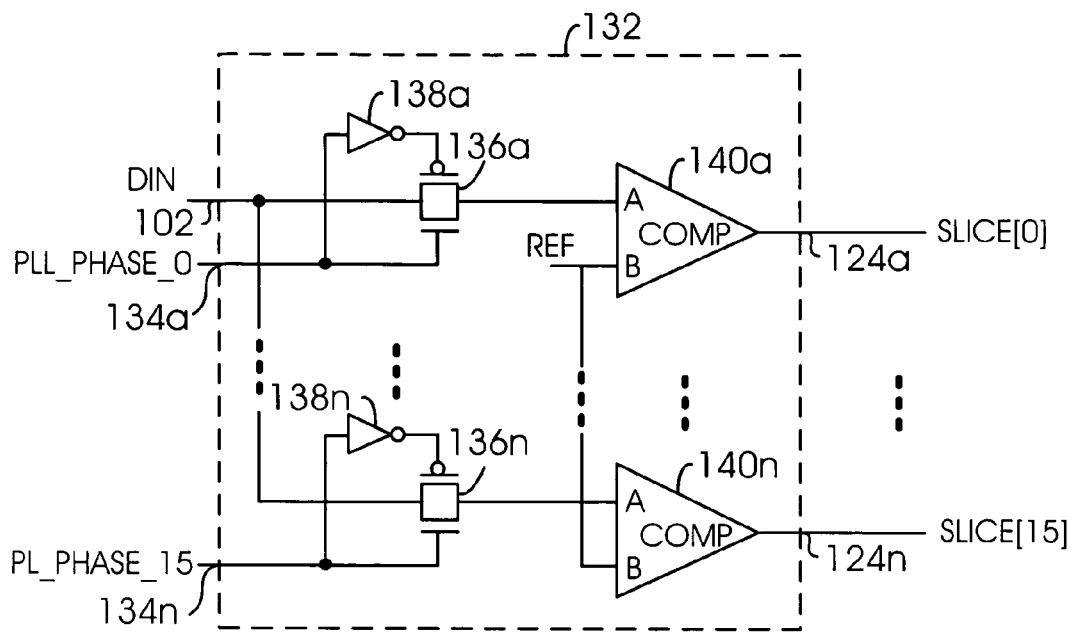
FIG. 3 is a more detailed block diagram of a sampler circuit of FIG. 1.

Referring to FIG. 3, a more detailed block diagram illustrating an implementation of a data sampler circuit 132 of FIG. 1 is shown. The circuit 132 may comprise a number of devices 136a–136n, a number of inverters 138a–138n, and a number of comparators 140a–140n. In one example, the devices 136a–136n may be implemented as CMOS pass gates (or transmission gates). The signal DIN may be presented to an input of each of the pass gates 136a–136n. The signals PLL_PHASE_0–PLL_PHASE_N may be presented to a first control input of the pass gates 136a–136n and an input of the inverters 138a–138n, respectively. The inverters 138a–138n may have an output that may present a signal to a second control input of the respective pass gates 136a–136n. The pass gates 136a–136n may have an output that may present a signal to a first input of a respective comparator 140a–140n. The switching threshold of the comparators 140a–104n may be set, for example, by a reference voltage level presented to a second input of each comparator 140a–140n. The comparators 140a–140n may be configured to present the signals SLICE[0]–SLICE[N]. The signals SLICE[0]–SLICE[N] may be referred to collectively as the signal SLICE. In one example, the circuit 132 may be configured to generate sixteen samples of the signal DIN (e.g., the signals SLICE[0]–SLICE[15] in response to sixteen phases of a reference signal (e.g., the signals PLL_PHASE_0–PLL_PAHSE_15).

Figure 4:
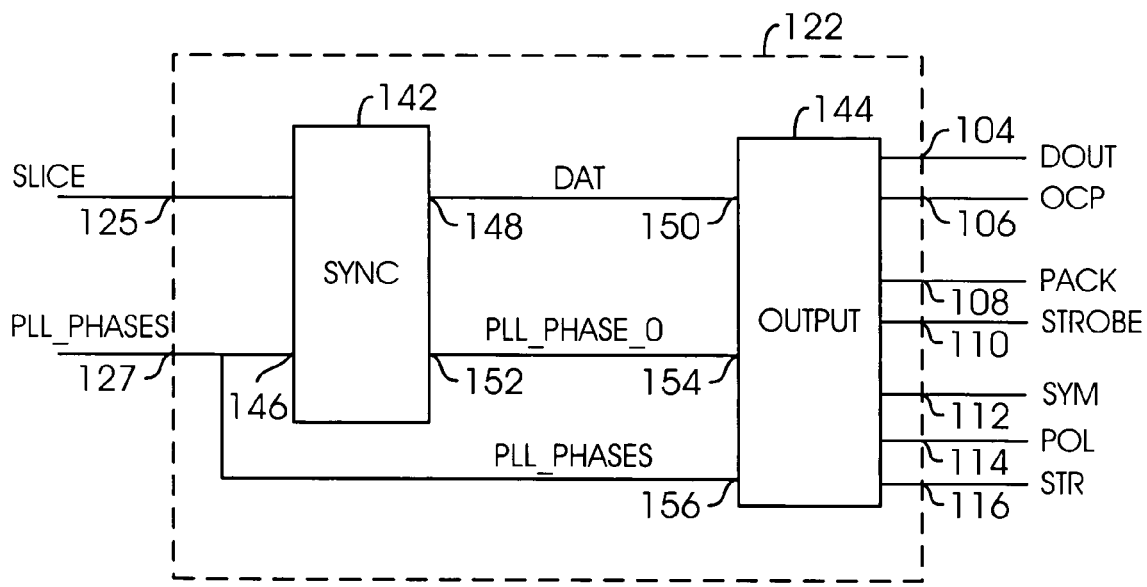
FIG. 4 is a more detailed block diagram of a data/clock recovery circuit of FIG. 1.

Referring to FIG. 4, a more detailed block diagram of the circuit 122 of FIG. 1 is shown. The circuit 122 may comprise, in one example, a circuit 142 and a circuit 144. The circuit 142 may be implemented as a data sample synchronization circuit. The circuit 144 may be implemented as a data output circuit. The signal SLICE may be presented to an input of the circuit 142. The circuit 142 may have an input 146 that may receive the signal PLL_PHASES, an output 148 that may present a signal (e.g., DAT) to an input 150 of the circuit 144, and an output 152 that may present one of the phases from the signal PLL_PHASES to an input 154 of the circuit 144 that may be used as a main system clock. The circuit 142 may be configured to generate the signal DAT in response to the signals SLICE and one or more phases of the signal PLL_PHASES. The circuit 144 may be configured to generate the signals DOUT, OCP, PACK, STROBE, SYM, POL, and STR in response to one or more of the signals DAT, PLL_PHASE_0, and PLL_PHASES Referring to FIG. 5, a more detailed block diagram illustrating an implementation of the data sample synchronization circuit 142 of FIG. 4 is shown. The circuit 142 generally comprises, but is not limited to, a device 160, a device 162, a 910 device 164, and a device 166. The device 160 may be implemented, in one example as a 16-bit register. The devices 162 and 164 may be implemented, in one example, 4-bit registers. Alternatively, the devices 162 and 164 may be implemented as a single 8-bit register. The device 166 may be implemented, in one example, as a 17-bit register. However, other size registers or devices may be implemented to meet the design criteria of a particular application. For example, the devices 160-166 may be implemented as latches. In general, the sizes of the registers 160, 162, 164, and 166 are determined by the number of samples in the signal SLICE.

The signals SLICE and PLL_PHASES may be presented to inputs of the register 160. Each of the logic level samples in the signal SLICE (e.g., SLICE[0]–SLICE[N]) may be registered in response to a respective phase of the signal PLL_PHASES (e.g., PLL_PHASES_0–PLL_PHASES_N). The registered samples for the bits [0–3] and the bits [12–15] of the signal SLICE may be clocked into the registers 162 and 164, respectively, in response to the signal PLL_PHASE_8. The register 162 and the register 164 are generally clocked by a signal that is 180 degrees out of phase with the main system clock (e.g., when there are 16 phases, the signal PLL_PHASE_8 will generally be 180 degrees out of phase with the signal PLL_PHASE_0). An output of the registers 162 and 164 and the remaining samples from the bits [4–11] of the signal SLICE are generally clocked into the register 166 in response to the main system clock (e.g., the signal PLL_PHASE_0). The signal PLL_PHASE_0 may also be used as the processing clock for other portions of the circuit 100. A bit of a previous signal DAT (e.g., BIT[0]) may be presented at an input of the register 166 as a reference for a new signal DAT.

Figure 6:
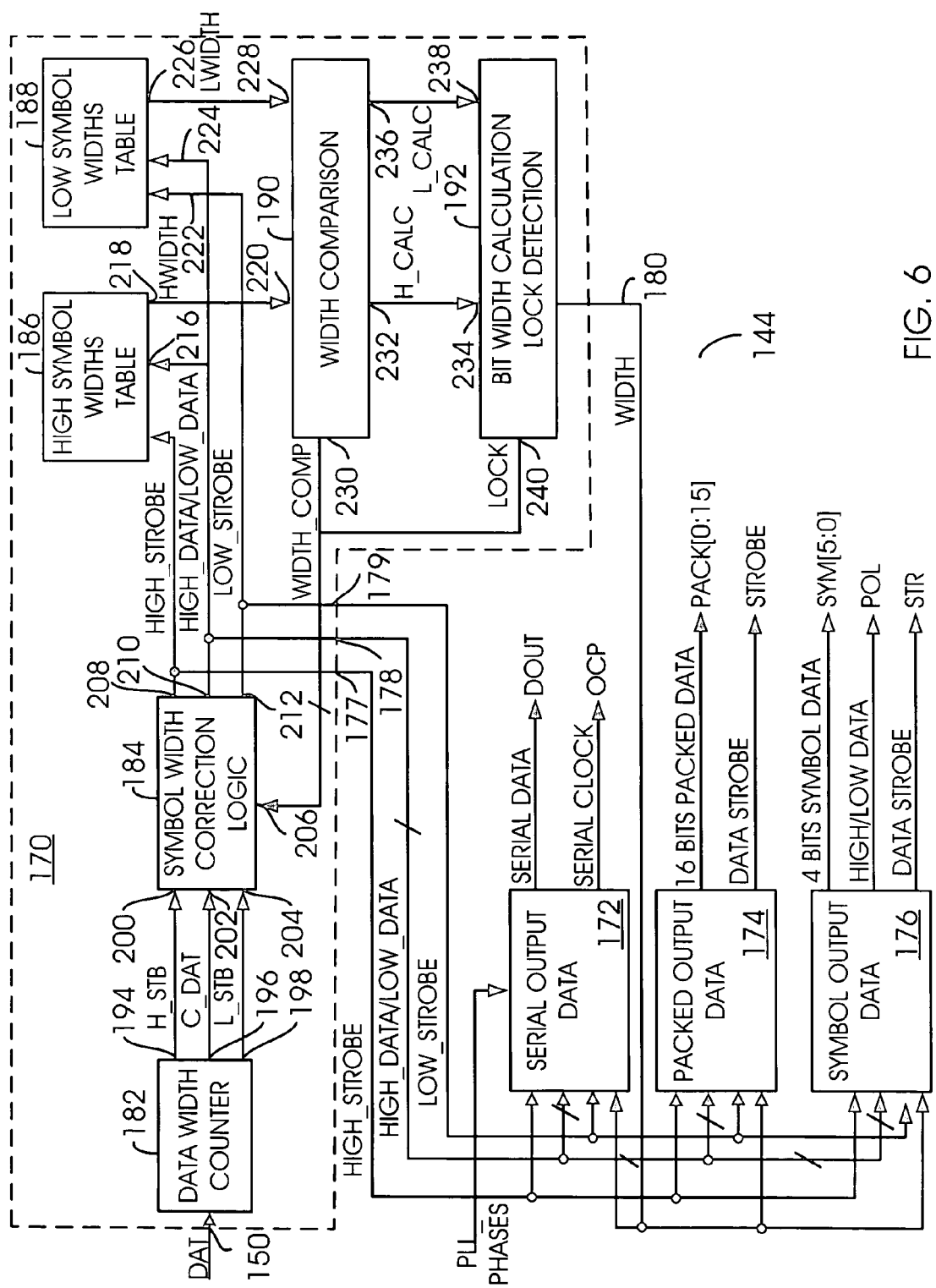
FIG. 6 is a more detailed block diagram of an output circuit of FIG. 4.

Referring to FIG. 6, a more detailed block diagram illustrating an implementation of the output circuit 144 of FIG. 4 is shown. The circuit 144 may comprise a circuit (or block) 170 and one or more output circuits (or blocks) 172, 174, and/or 176. The circuit 170 may be configured to determine a symbol width parameter and lock condition of the circuit 100. The circuit 172 may be implemented as a serial data output circuit. The circuit 174 may be implemented as a packed data output circuit. The circuit 176 may be implemented as a symbol data output circuit. The circuit 170 may have the input 150 that may receive the signal DAT, an output 177 that may present a signal (e.g., HIGH_STROBE), an output 178 that may present a number of signals (e.g., HIGH_DATA, LOW_DATA, etc.), an output 179 that may present a signal (e.g., LOW_STROBE), and an output 180 that may present a signal (e.g., WIDTH). The signal HIGH_DATA may be a HIGH symbol data signal. The signal LOW_DATA may be a LOW symbol data signal. The signal HIGH_STROBE may be a strobe signal that may be asserted when the signal HIGH_DATA contains logic HIGH data. The signal LOW_STROBE may be a strobe signal that may be asserted when the signal LOW_DATA contains logic LOW data. The signal WIDTH may be used to indicate a bit width of data contained in the signals HIGH_DATA and LOW_DATA. The circuit 170 may be configured to generate the signals HIGH_STROBE, HIGH_DATA, LOW_DATA, LOW_STROBE, and WIDTH in response to the signal DAT. The signal PLL_PHASE_0 may be presented as the system clock to all of the circuits (or blocks) of FIG. 6. The signal PLL_PHASE_0 may be used to synchronize the signal DAT (described in more detail in connection with FIG. 5).

The circuit 170 may comprise a circuit (or block) 182, a circuit (or block) 184, a circuit (or block) 186, a circuit (or block) 188, a circuit (or block) 190, and a circuit (or block) 192. The circuit 182 may be implemented as a data width counter circuit. The circuit 184 may be implemented as a symbol width correction logic circuit. The circuit 186 may be implemented as a storage circuit for width values of logic HIGH symbol data. The circuit 188 may be implemented as a storage circuit for width values of logic LOW symbol data. The circuit 190 may be implemented as a width comparison circuit configured to compare HIGH and LOW data width values from the circuits 186 and 188. The circuit 192 may be implemented as a bit width calculation and lock detection circuit.

The signal DAT may be presented to an input of the circuit 182. The circuit 182 may have an output 194 that may present a signal (e.g., H_STB), an output 196 that may present a signal (e.g., C_DAT), and an output 198 that may present a signal (e.g., L_STB). The circuit (or block) 182 may be configured to generate the signals H_STB, C_DAT, and L_STB in response to the signal DAT.

The circuit 182 may comprise an edge detection circuit. The signal DAT may be examined to detect data edges in a data stream represented by the signal DIN. When a data edge is detected, the exact position within the signal DAT is generally saved as a starting phase corresponding with a starting edge of a data symbol. From the starting edge of the data symbol until the next data edge is detected, the length of the current symbol may be accumulated according to the following equation EQ1:

$$Symbol\_length(n)=16-start\_phase(n)+16*\text{number of phase 0 clocks}+start\_phase(n+1),$$

where the number 16 represents the number of clock phases implemented.

The period immediately after the first data edge may contain further data edges caused by switching noise or minimal differences in the switching thresholds (e.g., an offset parameter) of the comparators in the circuit 132. The detection of new edges in the period immediately after the first data edge may be inhibited for a length of time that may be either programmed or set (e.g., when operating in the locked mode), by using some fraction of the signal WIDTH as soon as the value of the signal WIDTH is known. Inhibiting the detection of new edges based on the signal WIDTH may provide for a degree of noise suppression.

When the length of a new symbol is much greater than the expected length of any normal symbol, the greater length is probably due to a scratch on the media that presents the data contained in the signal DIN. The circuit 100 may be configured to generate a scratch signal (e.g., SCRATCH) whenever the detected symbol is longer than a predetermined value. The predetermined value may be provided by an externally programmed value. Alternately, the signal SCRATCH may be generated whenever the detected symbol is longer than any normal symbol could be (e.g., 20*T, where T represents a single bit time of the recovered data, or a number of phases determined by the signal WIDTH). The signal SCRATCH may be used by the system to discard bad data or initiate a reread of the same physical location of the media. However, other error handling protocols may be implemented using the signal SCRATCH to meet the design criteria of a particular application. The present invention may be configured so that a scratch in the media generally will not cause a loss of lock as would happen in an analog system.

The circuit 184 may have an input 200, an input 202, an input 204, an input 206, an output 208, an output 210, and an output 212. The signals H_STB, C_DAT, and L_STB may be presented to the inputs 200, 202, and 204, respectively. A number of signals (e.g., WIDTH_COMP, LOCK, etc.) may be presented to the input 206. The signal WIDTH- _COMP may comprise HIGH symbol width and LOW symbol width comparison values. The signal LOCK may be implemented to indicate when the circuit 100 is in a locked state. The signals HIGH_STROBE, HIGH_DATA, LOW_DATA, and LOW_STROBE may be presented at the outputs 208, 210, and 212, respectively. The circuit (or block) 184 may be configured to generate the signals HIGH_STROBE, HIGH_DATA, LOW_DATA, and LOW_STROBE in response to the signals H_STB, C_DAT, L_STB, LOCK, and WIDTH_COMP.

The symbol length determined by the circuit 182 may need to be corrected. The signal WIDTH_COMP may comprise one or more correction factors (signals) determined by evaluating the relative lengths of different symbol widths. The correction factors may be calculated when the circuit 100 has achieved a locked state. The signal WIDTH_COMP may comprise one or more multi-bit signals (factors) that may be used to adjust a current symbol length.

The signals HIGH_STROBE and HIGH_DATA may be presented to inputs 214 and 216 of the circuit (or block) 186, respectively. The circuit 186 may have an output 218 that may present a signal (e.g., HWIDTH) to an input 220 of the circuit (or block) 190. The signal HWIDTH may comprise information about the widths of data stored in the circuit 186. The signals LOW_STROBE and LOW_DATA may be presented to inputs 222 and 224 of circuit (or block) 188, respectively. The circuit 188 may have an output 226 that may present a signal (e.g., LWIDTH) to an input 228 of the circuit (or block) 190. The signal LWIDTH may comprise information about the widths of data stored in the circuit 188. The circuit 190 may have an output 230 that may present the signal WIDTH_COMP. The circuit 190 may be configured to generate the signal WIDTH_COMP in response to the signals HWIDTH and LWIDTH.

Since the value of the signal WIDTH generally defines the length of a single bit of data, the length of a data symbol (e.g., LENGTH) will generally be some integer multiple of the value of the signal WIDTH. However, the length of a symbol may vary by a number of phases without the value of LENGTH changing. The length of the data symbol after correction is generally assigned to either a HIGH data table (e.g., the circuit 186) or a LOW data table (e.g., the circuit 188) depending on whether the symbol is logically HIGH or logically LOW data. The logically HIGH and logically LOW data are generally separated because of the nature of the data stream (e.g., a read channel RF data stream). When media is written, many factors may contribute to distortion of the data. The same is generally true when the data is read back from the media. Particularly, when the media is read back in a different physical drive. The result of the distortion is generally that a detected length of a LOW data symbol of a certain length may not be equal to the detected length of a similar HIGH data symbol. The logically HIGH and logically LOW data may be analyzed separately to find the shortest symbols within the data stream. The shortest symbols of each data type may be assigned positions in a respective table (e.g., blocks 186 and 188) depending on their size, shortest first. When a symbol is placed into a table, a score is also assigned to the symbol. The score is generally incremented whenever a symbol of the same length is detected, and decremented whenever a symbol of different length is detected. The symbols generally must pass a number of tests before they can be assigned to a particular table position. The following processes outlines an example of such an assignment:

The length of a new symbol is checked against the lengths of other symbols of the same kind. HIGH symbols are compared to previous HIGH symbols. LOW symbols are compared to previous LOW symbols. The new symbol is checked to see whether the symbol length is the same as the length of the shortest existing table entry. In order to make the test less exacting, a range may be provided, within which the length of the symbol may fall in order for acceptance. In one example, the range may be set externally (e.g., user programmable). Alternatively, the range may be set as a fraction of the detected symbol width (e.g., the signal WIDTH) as soon as the signal WIDTH is available.

When the new symbol is accepted, the symbol is accumulated into the existing table position. The accumulation may provide a process for adjusting the values in the table over time, taking gradual drift into account. In one example, the accumulation process may average the values (e.g., add the new value to the old value and divide by 2). However, averaging without rounding may result in a value that is always lower than the correct average over time by at least one phase (e.g., erosure of the average). System noise may increase the variance. In an alternative accumulation process, the new entry may be calculated by adding the new symbol value, the old symbol value, and an integer value of one, then dividing by two. Truncating the least significant bit (LSB) will generally incorporate simple rounding to avoid the erosure over time.

When the new symbol is smaller than the shortest existing symbol, or when the table is empty, the new symbol is generally placed in the first position in the table. When the first position of a table is not empty, the first position and all other non-empty table positions, may be bumped up to a higher position in the table. When the table is full, the highest entry may be discarded when a new smaller entry has been detected.

When the symbol has been accepted, the score of the symbol is generally incremented and all the other scores of symbols of similar type (e.g., HIGH or LOW) are generally decremented. When a symbol does not pass any of the tests with respect to a particular table position, the other table positions with longer entries are generally checked in sequence. For example, testing may begin with the shortest symbol in a table and move toward the longest symbol. In general, regardless of the position in a table where testing begins, testing only advances toward the longer entries. When a new symbol is larger than any other symbol in the table, the score of each table entry of similar type is generally decremented. When a particular score is decremented to 0, the associated table entry of the score is generally vacated. When a table entry that becomes vacant is a low position in the table, higher entries of the table are generally shifted down to fill the vacated position.

The circuit 190 may have an output 232 that may present a signal (e.g., H_CALC) to an input 234 of the circuit 192 and an output 236 that may present a signal (e.g., L_CALC) to an input 238 of the circuit 192. Alternatively, the signals HWIDTH and LWIDTH may be presented to the inputs 234 and 238 respectively. The circuit 192 may be configured to generate the signals LOCK and WIDTH in response to the signals H_CALC and L_CALC (or the signals HWIDTH and LWIDTH). The circuit 192 may be further configured to detect when the circuit 100 has achieved the lock state in response to the signals H_CALC and L_CALC or the signals HWIDTH and LWIDTH). The signals H_CALC and L_CALC may comprise the values of the table entries and associated scores.

When the circuit 192 determines that the scores of all table entries have reached a predetermined level, the circuit 192 may be configured to indicate that the locked state has been achieved. In one example, the predetermined level may be set at a value of 128. When the lock state has been achieved, some of the previously described checks may be executed differently.

For example, when the lock state is achieved:

A new symbol length, that is shorter than one of the existing table entries, may not be automatically placed into the table. Instead, the new symbol length may be considered an error, and the score for the potential new entry may be assigned to an error counter. The error score my be dealt with the same way as the other scores. For example, when a symbol is recognized, the score of the symbol may be incremented and the other scores, including the error score, may be decremented.

When a score falls below a predetermined level, the circuit 100 may be considered to have lost lock. When the circuit 100 loses lock, the most likely cause is generally that a major change has taken place. As a result, when the circuit 100 loses lock, all scores and entries may be reset and the acquisition period may be restarted. In one example, when the error score reaches the lock threshold, a loss of lock may be detected and all entries and scores discarded.

In a preferred embodiment of the present invention, the lock threshold may be set to 128. However, other thresholds may be implemented accordingly to meet the design criteria of a particular implementation. When the score of all table entries exceeds the lock threshold, the circuit 100 is presumed to have successfully locked to the data stream. When the lock state has been achieved, a second, loss-of-lock, threshold may be set. When any score falls below the second threshold (e.g., a value of 120), lock may be presumed to have been lost. In one example, a maximum score may be a predetermined value. The predetermined value may be set in response to an external signal. The circuit 170 may be configured to not increment a score when incrementing would cause the score to increase beyond the predetermined value for the maximum score (e.g., a value of 255).

A system implementing the circuit 100 may provide a number of parameters to control the scoring mechanisms of the circuit 170. For example (i) a value HIT may define how much a score is incremented when a new symbol of the same size is recognized, (ii) a value MISS may define how much a score is decremented when the new symbol data is not of similar size, (iii) a value FAR may define how much a score is decremented when a new symbol is too large, (iv) a value EHIT may define how much an error score is incremented when a new symbol should be in the table (e.g., the new symbol is smaller than the largest table entry), and (v) a value EMISS may define how much the error score is decremented when a new symbol should be in the table (e.g., the new symbol is smaller than the largest table entry). The values HIT, MISS, FAR, EHIT, and EMISS may be set, in one example, in response to external signals.

An example operation of the present invention may be illustrated using the following presumptions: one bit period is 20 phases wide, HIT=32, MISS=1, FAR=2, and EHIT=20. Also, (for the sake of clarity) some asymmetry (+/−2 phases) is present. The illustration of how new data may be inserted into the tables, and how the scores may be adjusted in a preferred embodiment may be summarized in the following TABLE 1:

TABLE 1

| Line | Data | H1 | Sh1 | H2 | Sh2 | H3 | Sh3 | H4 | Sh4 | L1 | Sl1 | L2 | Sl2 | L3 | Sl3 | L4 | Sl4 |
|---|---|---|---|---|---|---|---|---|---|---|---|---|---|---|---|---|---|
| 1 | H82 | 82 | 32 | 0 | 0 | 0 | 0 | 0 | 0 | 0 | 0 | 0 | 0 | 0 | 0 | 0 | 0 |
| 2 | L98 | 82 | 32 | 0 | 0 | 0 | 0 | 0 | 0 | 98 | 32 | 0 | 0 | 0 | 0 | 0 | 0 |
| 3 | H102 | 82 | 31 | 102 | 32 | 0 | 0 | 0 | 0 | 98 | 32 | 0 | 0 | 0 | 0 | 0 | 0 |
| 4 | L118 | 82 | 31 | 102 | 32 | 0 | 0 | 0 | 0 | 98 | 31 | 118 | 32 | 0 | 0 | 0 | 0 |
| 5 | H80 | 81 | 63 | 102 | 31 | 0 | 0 | 0 | 0 | 98 | 31 | 118 | 32 | 0 | 0 | 0 | 0 |
| 6 | L58 | 81 | 63 | 102 | 31 | 0 | 0 | 0 | 0 | 58 | 32 | 98 | 30 | 118 | 31 | 0 | 0 |
| 7 | H121 | 81 | 62 | 102 | 30 | 121 | 32 | 0 | 0 | 58 | 32 | 98 | 30 | 118 | 31 | 0 | 0 |
| 8 | L80 | 81 | 62 | 102 | 30 | 121 | 32 | 0 | 0 | 58 | 31 | 80 | 32 | 98 | 29 | 118 | 30 |
| 9 | H140 | 81 | 61 | 102 | 29 | 121 | 31 | 140 | 32 | 58 | 31 | 80 | 32 | 98 | 29 | 118 | 30 |
| 10 | L78 | 81 | 61 | 102 | 29 | 121 | 31 | 140 | 32 | 58 | 30 | 79 | 64 | 98 | 28 | 118 | 29 |
| 11 | H122 | 81 | 60 | 102 | 28 | 122 | 63 | 140 | 31 | 58 | 30 | 79 | 64 | 98 | 28 | 118 | 29 |
| 12 | L58 | 81 | 60 | 102 | 28 | 122 | 63 | 140 | 31 | 58 | 62 | 79 | 64 | 98 | 28 | 118 | 29 |
| 13 | H62 | 62 | 32 | 81 | 59 | 102 | 27 | 122 | 62 | 58 | 62 | 79 | 64 | 98 | 28 | 118 | 29 |
| 14 | L118 | 62 | 32 | 81 | 59 | 102 | 27 | 122 | 62 | 58 | 61 | 79 | 63 | 98 | 27 | 118 | 61 |
| 15 | H142 | 63 | 30 | 81 | 57 | 102 | 25 | 122 | 60 | 58 | 61 | 79 | 63 | 98 | 27 | 118 | 61 |
| 16 | L158 | 63 | 30 | 81 | 57 | 102 | 25 | 122 | 60 | 58 | 59 | 79 | 61 | 98 | 25 | 118 | 59 | where the table has been set up to show a line number (LINE), the latest detected symbol (e.g., Data), 4 HIGH entries (e.g., H1–H4), their scores (e.g., Sh1–Sh4), 4 LOW entries (e.g., L1–L4) and their scores (e.g., SL1–SL4). Although a single table is shown, the table may be divided, in one example, into a HIGH table and a LOW table (e.g., the blocks 186 and 188).

On line 1, new high data is inserted into the first entry slot in the high data table, and the score is set to 32. On line 2, new low data is inserted into the first entry slot in the low data table, and the score is set to 32. On line 3, a larger high data symbol is inserted into the next available position in the high data table. The score of the previous entry is decremented by the value MISS. On line 4 new low data is dealt with the same way. Note that high data does not affect low entries or scores. On line 5, a new high symbol is accumulated into entry H1, and the scores are adjusted. On line 6, a smaller new low symbol is inserted into the first entry in the low table. On line 7, a new high data symbol becomes the third entry in the high table. On line 8, a new low data is inserted at position 2 in the low table, bumping the old larger data to higher positions in the table. On line 9, new high data fills the last empty entry slot in the high table. On line 10, new low data is accumulated into the low entry table and the scores are adjusted. On line 11, new high data is accumulated into the high entry table. On line 12, new low data is accumulated into the low table. On line 13, new high data that is smaller than any other high data is inserted into the lowest position in the high table. All other high data are bumped up, and the largest old data is discarded. On line 14, new low data is accumulated into the low table. On line 15, new high data that is larger than any in the high table causes the high scores to be decremented by the value FAR. On line 16, new low data that is larger than any in the low table causes the low scores to be reduced by the value FAR.

When the lock state is reached, several useful parameters may be derived from the table entries. For example, the operational mode of the circuit 100 is generally set by a host system (not shown). For DVD or CD media, the minimum length of a symbol may be 3 bit periods, often referred to as 3T. The circuit 100 may be used in other systems where the minimum symbol length is 1, 2, 3 or 4 bits. A minimum symbol length system parameter may be used to define the number of bits within the shortest valid symbol. Alternatively, the minimum symbol length may be extracted from the analyzed data stream. The minimum symbol length parameter may be externally defined to simplify the overall system. When the minimum symbol length is set to 3, the second entry in a table is generally 4 bits long. When the minimum symbol length is set to 1 bit, the fourth entry in the table is generally 4 bits long. The average of 4 high bits and 4 low bits is easily calculated to be the length of one bit. The result of adding the symbol length for 4 high bits with the symbol length for 4 low bits is symbol length for 8 bits. Dividing by 8, gives an average width of 1 bit. The result may be assigned to a register that stores the value WIDTH.

The difference between HIGH and LOW data may be determined by comparing symbols of the same nominal length. The difference value may be stored in a register as a value UNBAL. When the value WIDTH is known, the value WIDTH may be used to set the range of values around each table entry, that will be considered when examining a new symbol.

The relative lengths of the table entries known may be used to calculate the correction factors added to the detected symbol lengths, as previously described. The correction factors may be calculated by comparing the value of the same positions in the HIGH and LOW table entries. Generally, the shortest symbol in the table must be longer than the sum of the rise and fall times associated with each symbol. Otherwise, the shortest symbol may never be detected. By comparing the two largest entries, a correction factor may be generated. The correction factor may be used to improve the relative lengths. When the largest entries have been satisfactorily corrected, the next larger entries are compared (and so on) until all entries in one table after correction are essentially equal to their corresponding entries in the other table. Since the relationship between the HIGH and LOW entries may be non-linear, the simplest approach to achieving a proper correction may be by successively approaching the correct value rather than attempting to calculate and immediately apply a correction factor. The lack of linearity in the cause for incorrect data may lead to a false assumption that the shortest detected data is noise. Proper corrective measures may insure that valid data is not mistaken for noise. In order to accommodate for gradual drift over time (and over the media) the smallest possible correction is generally used and constantly checked.

When the table entries are compared, the result of the comparison may be used to generate two related factors, a rise time (e.g., RTIME) and a fall time (e.g., FTIME). The factor FTIME is generally increased when all HIGH entries are larger than their respective entries in the LOW table. The factor RTIME is generally increased when all LOW entries are larger than their respective entries in the HIGH table. The factor RTIME is generally decremented when the largest HIGH table entry is larger than the largest LOW table entry, but smaller HIGH table entries are smaller than their respective LOW table entries. The factor FTIME is generally decremented when the largest LOW table entry is larger than the largest HIGH table entry, but smaller LOW table entries are smaller than their respective HIGH table entries.

Figure 7:
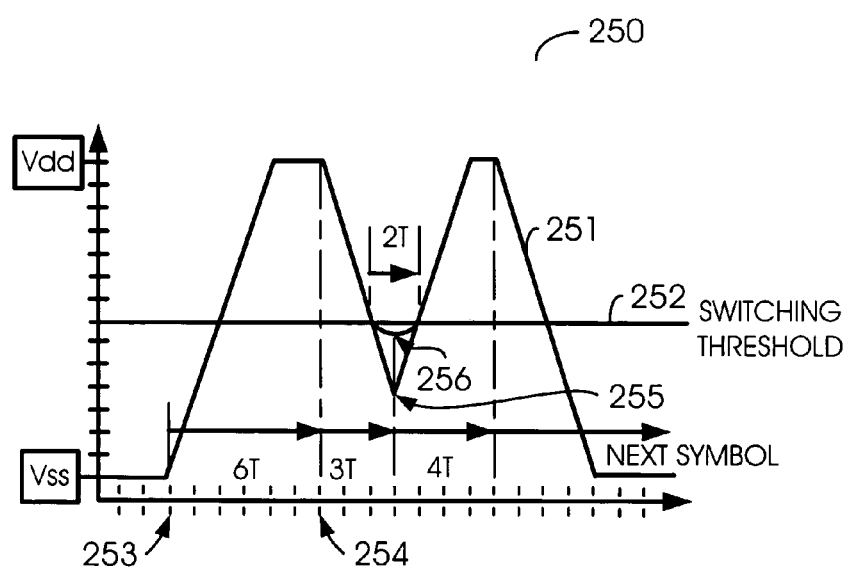
FIG. 7 is a timing diagram illustrating an example symbol timing.

Referring to FIG. 7, a timing diagram 250 illustrating an example data waveform in accordance with the present invention is shown. A trace 251 of the timing diagram 250 may illustrate an example symbol timing of the signal DIN. A trace 252 of the timing diagram 250 may illustrate an example switching threshold at the 50% point between VDD and VSS. For example, a 6T symbol may start off at VSS (e.g., a point 253) and reach the switching threshold 252 after a period of 2T. After a period of 4T, the symbol level may reach VDD where the level may remain until the 3T symbol starts (e.g., the point 254). The 3T symbol may be so short that the symbol level only drops to about VDD/4 (e.g., the point 255). The value may actually be rounded up due to bandwidth constraints throughout the system (e.g., the point 256). The following 4T symbol then starts off at about VDD/4 and reaches VDD where the level remains for about 1T before the next symbol starts off again towards VSS. The threshold crossing period resulting from the 3T symbol may be only 2T wide as shown. The 4T symbol may have a period of 5T from threshold crossing to threshold crossing, due to the early start of the change in polarity. Each symbol progression may result in a different sharing of the available real time, starting from the signal level at the point in time where a new symbol starts.

The calculation of RTIME and FTIME may presume the switching threshold 252 between HIGH and LOW lies at the 50% point between VDD and VSS. When the examination of all table entries is complete, the factor RTIME generally represents the time of the excursion from VSS to the switching threshold 252, and the factor FTIME generally represents the time of an excursion from VDD to the switching threshold 252. However, the switching threshold 252 at the 50% point between VDD and VSS is the nominal case. In most cases, the real switching threshold 252 may be at some level other than the 50% point between VDD and VSS. For example, in a non-nominal condition, the switching threshold 252 may be anywhere between 10% and 90% of the VDD–VSS range. In one example, when the switching threshold 252 is lower than the 50% point between VDD and VSS, the region marked with "2T" may appear to be shorter than the measurable 2T as seen by the sampler circuit.

When the rise and fall times of the signal DIN are not the same, a more accurate representation may be required. When the rise and fall times of the signal DIN are not the same, the switching threshold 252 may appear to be different from the nominal 50%. Two RTIME and two FTIME parameters may be required in order to correctly estimate the width of a high or low symbol, especially when the signal excursion may not reach either VSS or VDD for short symbols. The two parameters of RTIME may be (i) the time from VSS to the switching threshold 252 and (ii) the time from the switching threshold 252 to the point where the signal DIN starts dropping towards VSS again, where the drop occurs before reaching VDD. The two parameters of FTIME may be similarly defined.

The factor RTIME and the factor FTIME may be used to generate two fractions:

$$RFRAC=RTIME/(RTIME+FTIME);\text{ and}$$

$$FFRAC=FTIME/(RTIME+FTIME).$$

The fractions RFRAC and FFRAC may be used to determine the portion of a symbol width that is taken up by rise time and fall time, respectively. The portion of RTIME or FTIME that happens between the turning point and the switching threshold may be taken into account in the RFRAC and FFRAC calculations. Each symbol length value may be multiplied by the factor RFRAC and the value FFRAC to generate a value RTFRAC and a value FTFRAC, respectively. The value RTFRAC and the value FTFRAC are generally only used when the symbol is shorter than the sum of the value RTIME+the value FTIME. When the accuracy of the calculations is inadequate in a particular application, other periods of time may be taken into account to meet the design criteria of a particular application.

The length of a symbol is generally dependent upon the writing operation. Starting at a point in time where HIGH data is written on the media, a certain amount of time passes before the switching threshold of the read amplifier is reached, and a further amount of time passes before VDD is reached. When writing LOW data, a similar process takes place where some time passes before the switching threshold of the amplifiers is reached, and some further time passes until VSS is reached. The real length of a symbol is the time between when writing has started for one symbol until the time writing starts for the following symbol, rather than the time between successive crossings of the amplifier input threshold.

When the detected symbol length is greater than the sum of the factor RTIME and the factor FTIME, the final size may be determined as follows:

When the symbol represents HIGH data, $$HIGH\_DATA=SYMBOL\_LENGTH+PT-RTIME,$$

where HIGH_DATA is the final value for the symbol, SYMBOL_LENGTH is the length of the symbol detected by an edge detector logic block (or circuit) 182, PT is the portion of fall time left over from a previous symbol and RTIME is previously determined as discussed above. The new PT value may be set to RTIME.

Comparing the above example with the example waveform of FIG. 7, the real time used by the 6T symbol is the time from when the signal starts rising towards VDD until it starts falling from VDD towards VSS again. The time is measured from threshold crossing to threshold crossing. The RTIME component is generally added to the measured time and the FTIME component is generally subtracted to get the correct time.

When the symbol is LOW data, $$LOW\_DATA=SYMBOL\_LENGTH+PT-FTIME,$$

where LOW_DATA is the final value for the symbol, SYMBOL_LENGTH is the length of the symbol detected by the edge detector logic block or circuit 182, PT is the portion of rise time left over from the previous symbol and the factor FTIME is previously determined as discussed above. The new PT value may be set to FTIME.

When the detected symbol length is less than the sum of the factor RTIME and the factor FTIME, the final size of the symbol may be determined as follows:

When the symbol is HIGH data, HIGH_DATA=PT+ RTFRAC, where HIGH_DATA is the final value for the symbol, PT is the portion of fall time left over from the previous symbol and RTFPAC is the portion of the value SYMBOL_LENGTH previously calculated. The new PT value may be set to the value FTFRAC which may be the unused fraction of the value SYMBOL_LENGTH just calculated.

When the symbol is LOW data, LOW_DATA=PT+FT-FRAC, where LOW_DATA is the final value for the symbol, PT is the portion of rise time left over from the previous symbol and FTFRAC is the portion of SYMBOL_LENGTH previously calculated. The new PT value may be set to the value RTFRAC which may be the unused fraction of SYMBOL_LENGTH just calculated. The result of these HIGH and LOW symbol length calculations may be used in the entry tables to determine the bit width value for use in all further processing.

Figure 8:
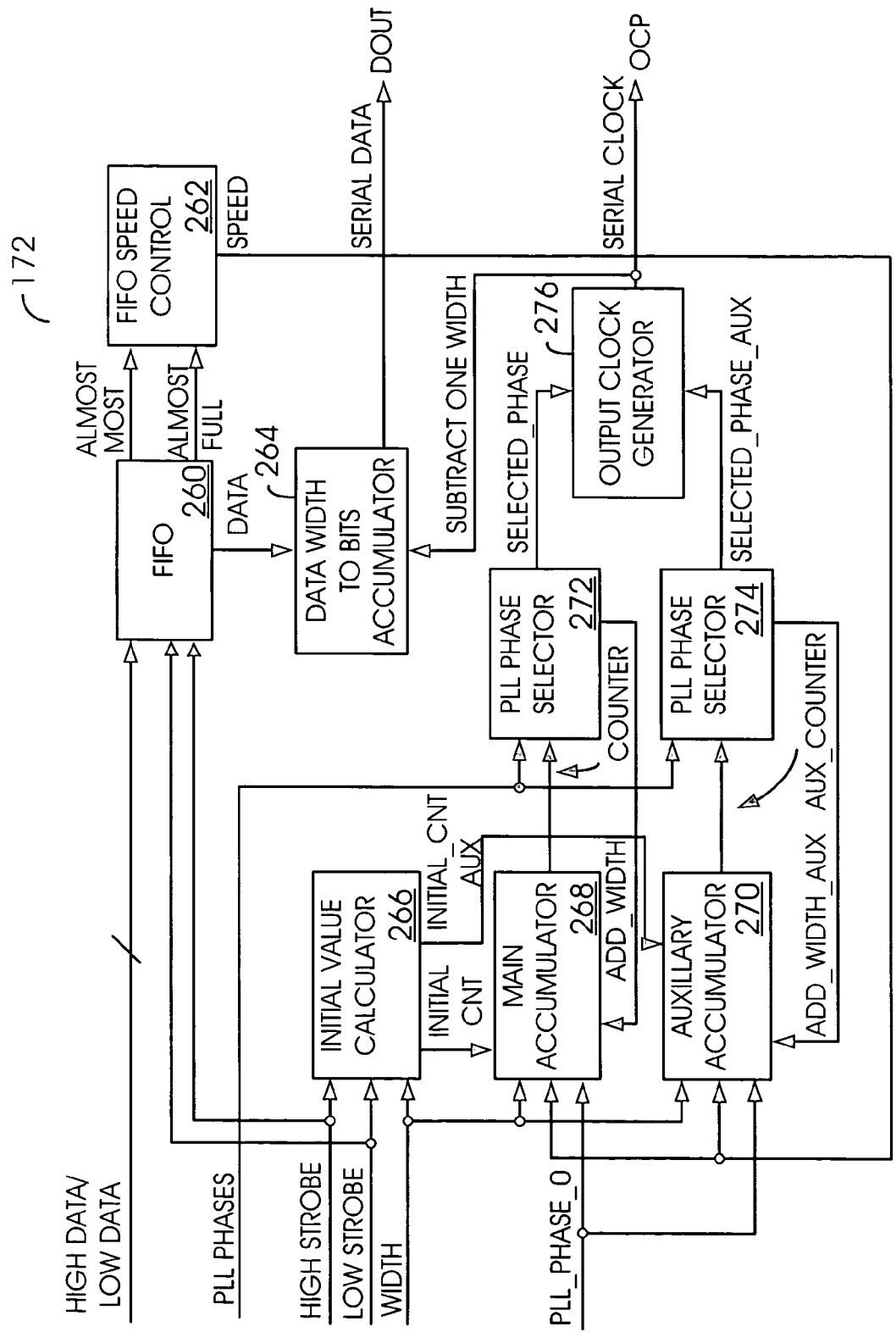
FIG. 8 is a more detailed block diagram of a serial output block of FIG. 6.

Referring to FIG. 8, a more detailed block diagram of a serial output circuit 172 of FIG. 6 is shown. The circuit 172 may comprise a storage element 260, a circuit 262, a circuit 264, a circuit 266, a circuit 268, a circuit 270, a circuit 272, a circuit 274, and a circuit 276. The storage element 260 may be implemented as a FIFO memory. In one example, the FIFO 260 may be implemented as an 8-word deep FIFO. However other size FIFOs or memory types may be implemented accordingly to meet the design criteria of a particular application. In one example, the FIFO 260 may be implemented without re-synchronization logic. The circuit 262 may be implemented as a control circuit. The circuit 264 may be implemented as a data width to bits accumulator circuit. The circuit 266 may be implemented as an initial value calculator circuit. The circuits 268 and 270 may be implemented as accumulator circuits. The circuit 272 and 274 may be implemented as selector circuits. The circuit 276 may be implemented as an output clock generator circuit.

The signals HIGH_DATA, LOW_DATA, HIGH_STROBE, and LOW_STROBE may be presented to inputs of the FIFO 260. The FIFO 260 may be configured to present a signal (e.g., ALMOST_EMPTY) and another signal (e.g, ALMOST_FULL) to inputs of the circuit 262. The circuit 262 may be configured to generate a signal (e.g., SPEED) in response to the signals ALMOST_EMPTY and ALMOST_FULL from the FIFO 260. The signal SPEED may be used to adjust the period of the signal OCP. The circuit 264 may receive data from the FIFO 260. The circuit 264 may be configured to generate the signal DOUT in response to the data received from the FIFO 260 and the signal OCP.

The signals HIGH_STROBE and LOW_STROBE may be presented to a first and a second input, respectively, of the circuit 266. The signal WIDTH may be presented to a third input of the circuit 266, a first input of the main accumulator 268, and a first input of the auxiliary accumulator 270. The circuit 266 may have a first output that may present a signal (e.g., INITIAL_CNT) to the circuit 268 and a second output that may present a signal (e.g., INITIAL_CNT_AUX) to the circuit 270. The output signals may be generated in response to the signals HIGH_STROBE, LOW_STROBE, and WIDTH.

The accumulator 268 may have a second input that may receive the signal SPEED and a third input that may receive the phase of the signal PLL_PHASES selected as the system phase (e.g., PLL_PHASE_0). The main accumulator 268 may have an output that may present a signal (e.g., COUNTER) to an input of the selector circuit 272. The circuit 268 may have an input that may receive a signal (e.g., ADD_WIDTH) from an output of the selector circuit 272.

The circuit 268 may be configured to generate the signal COUNTER in response to the signals WIDTH, SPEED, PLL_PHASE_0, and ADD_WIDTH.

The accumulator 270 may have a second input that may receive the signal SPEED and a third input that may receive the phase of the signal PLL_PHASES selected as the system phase (e.g., PLL_PHASE_0). The auxiliary accumulator 270 may have an output that may present a signal (e.g., AUX_COUNTER) to an input of the selector circuit 274. The circuit 270 may have an input that may receive a signal (e.g., ADD_WIDTH_AUX) from an output of the selector circuit 274. The circuit 270 may be configured to generate the signal AUX_COUNTER in response to the signals WIDTH, SPEED, and PLL_PHASE_0, and ADD_WIDTH_AUX.

The selector circuits 272 and 274 may have an input that may receive the signal PLL_PHASES. The circuit 272 and the circuit 274 may each be configured to present one of the number of phases contained in the signal PLL_PHASES (e.g., a SELECTED_PHASE and a SELECTED_PHASE_AUX, respectively) in response to the signals COUNTER and AUX_COUNTER, respectively. The circuit 272 and the circuit 274 may each have an output that may present the respective selected phase signals SELECTED_PHASE and SELECTED_PHASE_AUX to a respective input of the circuit 276. The circuit 276 may be configured to generate the signal OCP in response to the signals SELECTED_PHASE and SELECTED_PHASE_AUX.

The accumulators 268 and 270 may be set up with a value that may allow synchronization to the data stream to occur as quickly as possible. The setup value may be used to align the main system clock (e.g., PLL_PHASE_0) to the center of a bit time in order to avoid the switching moment at the edges of data symbols. The setup value may be determined by the initial value calculator 266. The two accumulators 268 and 270 may be implemented to provide two clock edges of the signal OCP within a single cycle of the main system clock. Two clock edges of the signal OCP within a single cycle of the main system clock may be required when the bit period is less than the total number of PLL phases implemented (e.g., 16 PLL phases). The present invention may be configured to operate with bit periods down to 12 PLL phases of width. When an output clock is generated, both accumulators 268 and 270 are generally incremented by the value of the signal WIDTH in response to the signals ADD_WIDTH and ADD_WIDTH_AUX, respectively. When the bit period is 16 PLL phases or more, the auxiliary accumulator 270 generally does not reach a value within a range needed to cause a phase to be selected (e.g., main accumulator value+WIDTH). When the bit period is 16 PLL phases or more, an output clock is generally generated in response to the signal COUNTER.

The signals HIGH_DATA and LOW_DATA are generally passed through the FIFO 260 to permit queuing and successive processing of the detected symbols into the signal DOUT. The signal DOUT may be generated by dividing up the value of the length of a new symbol into portions determined by the signal WIDTH. Each portion may be presented as the signal DOUT with the signal OCP. The signal OCP may be generated by initializing an accumulator (e.g., the circuit 268) with a value related to the detected value WIDTH, and decrementing the counter towards 0 by the number of PLL phases (e.g., in steps of 16 when 16 phases are available). The value WIDTH generally corresponds to the time of a single bit of data represented as a number of PLL phases. Each clock cycle, the value of the signal COUNTER is decremented by the number of PLL phases available. When the value of the signal COUNTER is in the range of 4 to 20, the signal COUNTER may be used as a pointer to select one of the PLL phases (e.g., PLL_PHASES_0–PLL_PHASES_N) as the signal OCP. The accumulator is then incremented by the value of the signal WIDTH. The value WIDTH may be presented as an integer number of PLL phases.

The block 262 may be configured to compensate for potential under-runs and over-runs of the FIFO 260 by speeding up or slowing down the serial clock generation. The signal ALMOST_FULL will generally cause the output clock OCP to occur more often by reducing the cycle time by one PLL phase. The signal ALMOST_EMPTY will generally cause the output clock OCP to be slowed down by increasing the cycle time by one PLL phase. As long as the control signals SELECTED_PHASE and SELECTED_PHASE_AUX are active, the circuit 276 will generally continue to produce the output clock OCP of either slightly longer or slightly shorter periods. The compensation may be necessary because the width of data in the data stream will generally be a real number rather than an integer number of PLL phases. Over time, the value of WIDTH, which is an integer, will generally prove to be inaccurate. By slightly increasing or decreasing the period of the output clock, the present invention may correct for the inaccuracy.

When the FIFO 260 is close to full, the period of the signal OCP may be shortened, (e.g., the width is manipulated, to increase the bit rate). When the FIFO 260 is close to empty, the period of the signal OCP may be extended to slow down the bit rate. Adjusting the clock rate may minimize jitter because the clock rate is generally changed by one phase at a time. In general, there are no major changes in the clock rate, rather, one phase may be inserted or removed to slow down or speed up the bit rate, respectively.

The serial output circuit 172 may comprise a dual accumulator circuit that allows the generation of frequencies greater than the PLL frequency. When the lock state has been detected (e.g., all width scores are greater than 128), the value of the signal WIDTH is generally greater than zero. When the value of the signal WIDTH is greater than zero, the generation of the signal OCP may be enabled. In order to provide a clock that is well placed relative to the data, the accumulators 268 and 270 may be initialized to values that are related to the bit width. The auxiliary accumulator 270 may be initialized to the same value as the main accumulator 268, plus the bit width. When the bit width value is less than 16 (or the number of phases the PLL provides), two output clock edges may be generated within the same clock cycle.

The value in each accumulator 268 and 270 is generally monitored constantly. Each clock cycle, the accumulators 268 and 270 are decreased by 16 (e.g., the number of PLL phases) until the remainder is within the range of the phase selectors 272 and 274. When the remainder is within the range of the phase selectors 272 and 274, a phase is selected, and both accumulators 268 and 270 are increased by one bit width (e.g., the value of the signal WIDTH). The state of the FIFO 260 is also monitored. When the FIFO 260 is almost empty, the value used to decrement the accumulators 268 and 270 is generally set to 15 (e.g., the number of PLL phases minus one), thus slowing down the process of decrementing the accumulators 268 and 270. When the FIFO is almost full, the value used to decrement the accumulators 268 and 270 is increased to 17 (e.g., the number of PLL phases plus one), thus speeding up the process.

Figure 9:
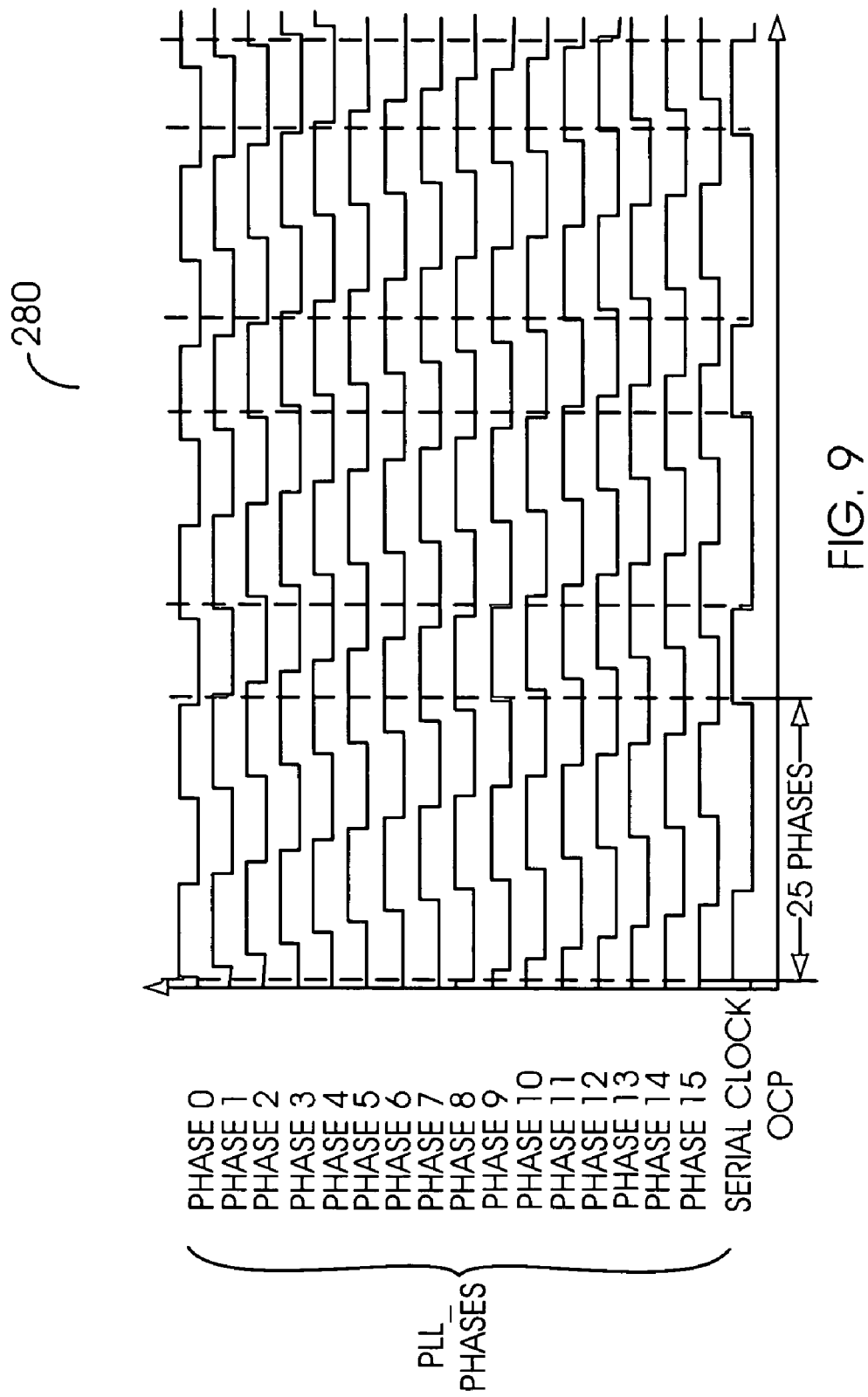
FIG. 9 is a timing diagram illustrating an example output clock of the present invention.

Referring to FIG. 9, a timing diagram 280 illustrating various example waveforms of the serial output circuit of FIG. 8. The period of the signal OCP may be set in response to the signal WIDTH. The signal OCP may comprise the high phase period of a succession of selected PLL phases. In general, each clock is just as wide as the selected phase. For example, when the PLL fundamental frequency is 100 MHz, each phase will generally be 10 nS wide. With a 50% duty cycle, the high period of each phase is generally 5 nS wide. Average system requirements may expect at least 2 nS of low time on each clock period. The system requirements may limit the rate of the signal OCP to a period of 7 nS or about 140 MHz. With faster PLL frequencies, faster output clocks may be generated, up to the limits of the host system. In one example, the signal OCP may be generated having a period of 25 rising edges of the signal PLL_PHASES (e.g., the trace labeled "Serial Clock OCP").

Figure 10:
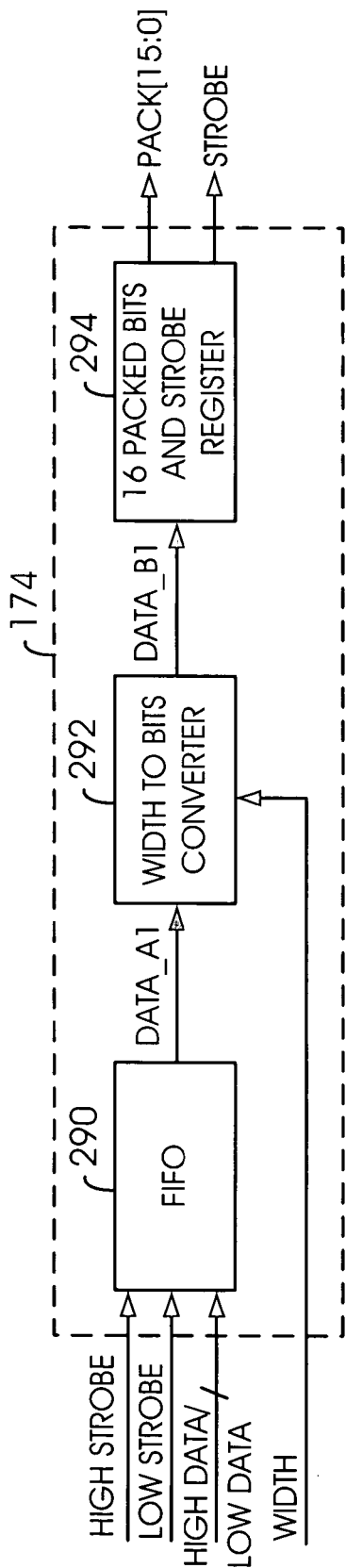
FIG. 10 is a more detailed block diagram of a packed data output block of FIG. 6.

Referring to FIG. 10, a more detailed block diagram of a packed output data circuit 174 of FIG. 6 is shown. The circuit 174 may be configured to generate packed data (e.g., signal PACK[0:15]. The circuit 174 may comprise a FIFO 290, a width-to-bits converter 292, and an output register 294. The FIFO 290 may have a number of inputs that may receive the signals HIGH_STROBE, LOW_STROBE, HIGH_DATA, and LOW_DATA, and an output that may present a signal (e.g., DATA_A1) to an input of the converter 292.

The converter 292 may have an input that may receive the signal WIDTH and an output that may present a signal (e.g., DATA_B1) to an input of the circuit 294. The circuit 292 may be configured to convert the signals HIGH_DATA and LOW_DATA from width to bits in response to the signal WIDTH. The circuit 294 may be configured to generate the signal PACK[15:0] (e.g., a 16 bit packed data signal) and the strobe signal STROBE in response to the signal DATA_B1. The number of bits in the packed data signal may be varied to meet the design criteria of a particular application.

The data in the signals HIGH_DATA and LOW_DATA may be queued through a small (e.g., 3-word deep) FIFO 290 so that data over-runs due to processing at the highest data rates is generally error free. In the packed data format, the data width is generally converted into a series of data bits that are packed into a 16 bit wide data word. Each bit is generally set according to the strobe (e.g., HIGH_STROBE or LOW_STROBE) that registered the data into the FIFO 290. For example, the signal HIGH_STROBE may set a bit to be packed to a HIGH logic level (or "1") and the signal LOW_STROBE may set the bit to be packed to a logic LOW state (or "0"). Packed data may be generated by dividing the new symbol length into chunks the size of the value WIDTH, and then filling up the output register circuit 294 with one bit for each chunk and setting the appropriate polarity. In one example, a sequence of 4 bits high, 5 bits low, 4 bits high, 3 bits low will produce "1111.0000.0111.1000" where the "." is used only for legibility.

The actual packing of the data is generally done 4 bits at a time. When a new symbol is available, the value of 4 bits is subtracted from the new symbol as often as possible while filling in the output register with 4 ones for HIGH data or 4 zeros for LOW data. When the remainder of the new symbol is less than the value of 4 bits, the first bits in the segment of the output register 294 are set to ones for HIGH data or zeros for LOW data and the other bits to the opposite value. The last step is valid because, by design, there is no legal symbol of less than 3 bits. The bits may be borrowed and may be first subtracted from the next symbol before any other processing.

Figure 11:
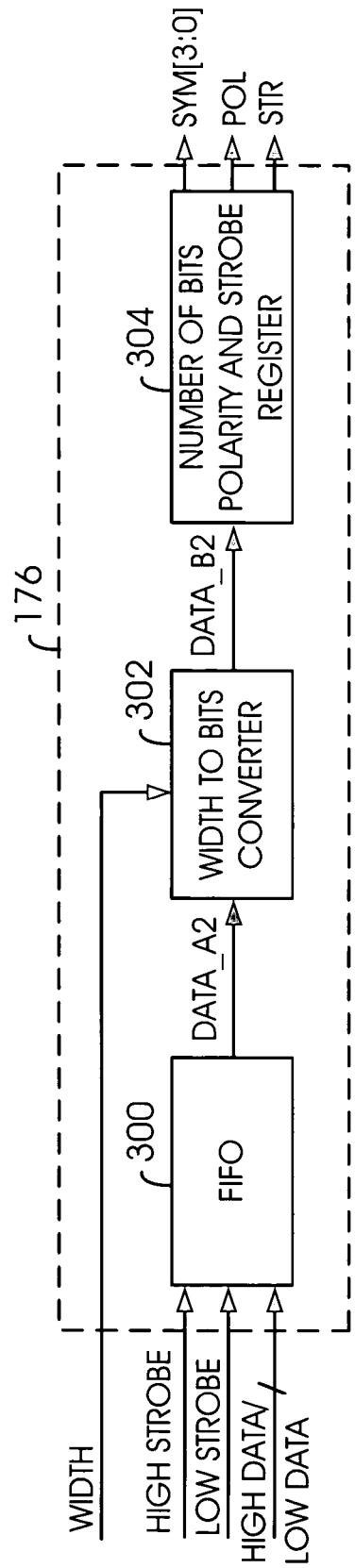
FIG. 11 is a more detailed block diagram of a symbol data output block of FIG. 6.

Referring to FIG. 11, a more detailed block diagram of a symbol data output circuit 176 of FIG. 6 is shown. The circuit 176 may be configured to generate symbol data. The circuit 176 may comprise a FIFO 300, a width-to-bits converter 302, and an output register 304. The FIFO 300 may have a number of inputs that may receive the signals HIGH_STROBE, LOW_STROBE, HIGH_DATA, and LOW_DATA, and an output that may present a signal (e.g., DATA_A2) to an input of the converter 302.

The converter 302 may have an input that may receive the signal WIDTH and an output that may present a signal (e.g., DATA_B2) to an input of the circuit 304. The circuit 302 may be configured to convert the signal DATA_A2 from width to bits in response to the signal WIDTH. The circuit 304 may be configured to generate the signal SYM (e.g., a 4 bit symbol data signal), the signal POL, and the strobe signal STR in response to the signal DATA_B2.

Symbol data may be generated by dividing the new symbol length into chunks the size of the value WIDTH. The number of chunks may be presented with a signal indicating the polarity of the new symbol (e.g., the signal POL), and a strobe (e.g., the signal STR) that indicates that new data is present on the output. Since the number of bits is generally limited to 14 in a DVD or CD implementation, a 4-bit output bus may be adequate. In one example, data that is longer than the expected length of any normal symbol (e.g., a scratch) will generally result in the symbol data being set to a maximum value (e.g., 15 when the symbol data is implemented as 4 bits). The data may be queued through a 3-word deep FIFO so that data over-runs due to processing at the highest data rates is generally error free. The symbol data format generally outputs a number that describes the number of bits in the current data width. The polarity is generally set by in response to the strobe signal that loaded the data (e.g., HIGH_STROBE or LOW_STROBE). The strobe signal STR is generally generated each time a new data width is processed. In the example mentioned above, the division may be implemented by subtracting a 4-bit width value from the symbol length as often as possible while adding up the bits into the output register 304. When 4 bits can no longer be subtracted, the width of the remainder (e.g., 0, 1, 2, or 3 bits) is checked and rounded to the nearest bit length. The total is output when the whole symbol value has been processed.

In general, symbol data and packed data have little or no problems with synchronization due to the fact that the output data is generated using the main processing clock (e.g., PLL_PHASE_0) of the circuit 100. The packed data and symbol data may improve system performance in unusual ways. The symbol data may be used to identify the individual symbols later in the process. The circuit 100 may provide the symbol data without an increase in complexity or circuitry. The packed data may allow other circuits connected to the circuit 100 to realign the data with ease, relieving the rest of the system of a task that may otherwise be difficult.

Serial data is generally more difficult to generate due to the fact that the PLL phase chosen as an output clock may change from bit to bit. However, by including a synchronizer stage (e.g., the circuit 142) that takes the particular clock phase used for output into account, adequate results may be obtained. When the chosen phase could collide with the main processing clock, which is generally derived from the signal PLL_PHASE_0, an intermediate stage may be used that may be clocked by a signal that is 180 degrees out of phase (e.g., PLL_PHASE_8 in a 16 phase implementation).

Figure 12:
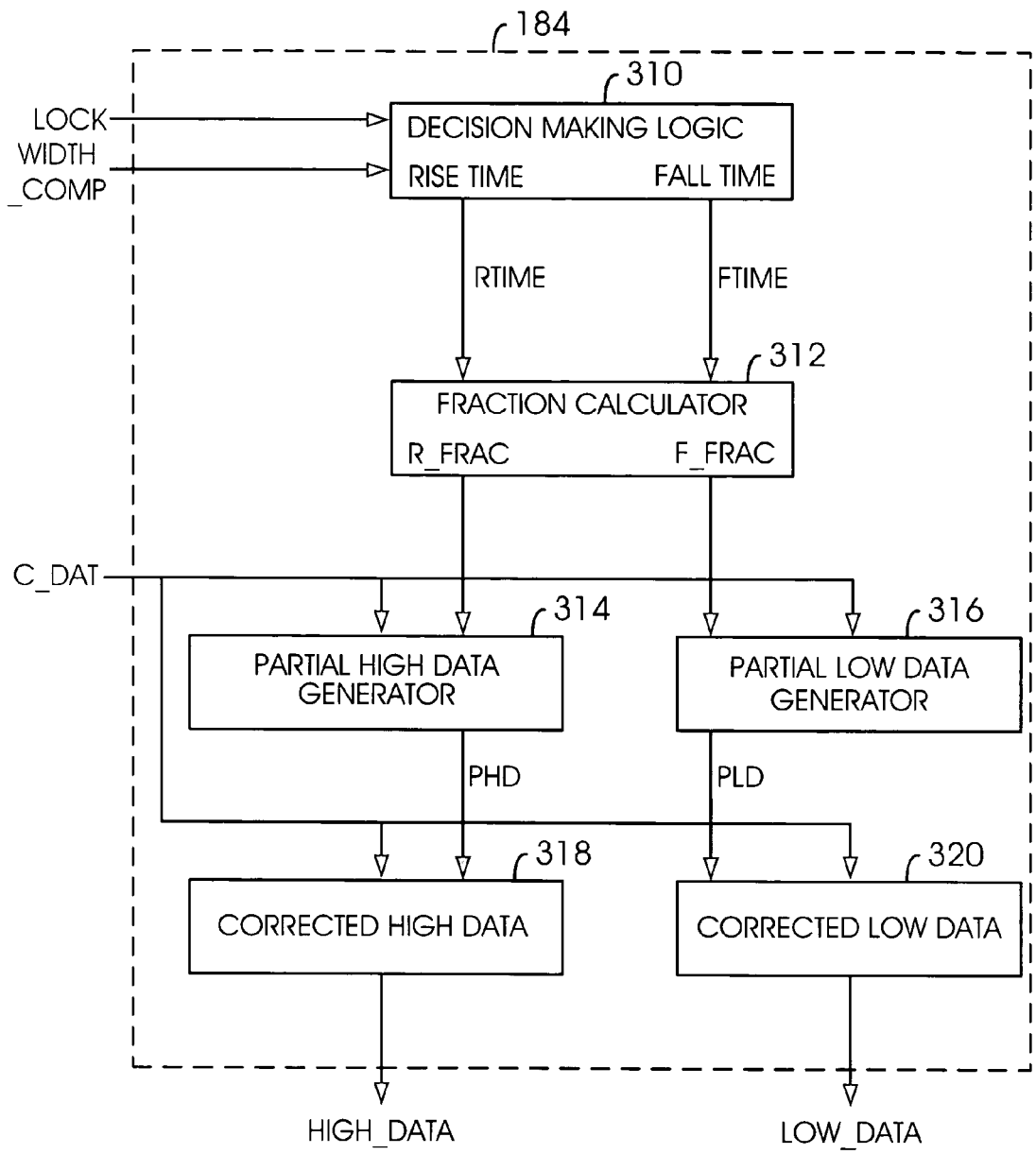
FIG. 12 is a more detailed block diagram of a symbol width correction logic block of FIG. 6.

Referring to FIG. 12, a more detailed block diagram of the circuit 184 of FIG. 6 is shown. The circuit 184 may comprise a circuit (block) 310, a circuit (block) 312, a circuit (block) 314, a circuit (block) 316, a circuit (block) 318, and a circuit (block) 320. The circuit 310 may be implemented as a decision making logic circuit. The circuit 312 may be implemented as a fraction calculator circuit. The circuit 314 may be implemented as a partial high data generator. the circuit 316 may be implemented as a partial low data generator. The circuit 318 may be implemented as a high data correction circuit. The circuit 320 may be implemented as a low data correction circuit.

The signals LOCK and WIDTH_COMP may be presented to the circuit 310. The circuit 310 may be configured to generate the values RTIME and FTIME (described in detail above in connection with FIG. 7) in response to the signals LOCK and WIDTH_COMP. The circuit 310 may present the values RTIME and FTIME to the circuit 312. The circuit 312 may be configured to generate the values (factors) R_FRAC and F_FRAC (described in detail above in connection with FIG. 7) in response to the values RTIME and FTIME.

The signal (factor) R_FRAC and the signal C_DAT may be presented to inputs of the circuit 314. The circuit 314 may be configured to present a signal (e.g., PHD) to an input of the circuit 318. The signal PHD may be a partial HIGH data signal. The circuit 314 may be configured to generate the signal PHD in response to the signals C_DAT and R_FRAC.

The signal (factor) F_FRAC and the signal C_DAT may be presented to inputs of the circuit 316. The circuit 316 may be configured to present a signal (e.g., PLD) to an input of the circuit 320. The signal PLD may be a partial LOW data signal. The circuit 316 may be configured to generate the signal PLD in response to the signals C_DAT and F_FRAC.

The signal C_DAT may be presented to an input of the circuit 318. The circuit 318 may have an output that may present the signal HIGH_DATA. The circuit 318 may be configured to generate the signal HIGH_DATA in response to the signals C_DAT and PHD.

The signal C_DAT may be presented to an input of the circuit 320. The circuit 320 may have an output that may present the signal LOW_DATA. The circuit 320 may be configured to generate the signal LOW_DATA in response to the signals C_DAT and PLD.

Figure 13:
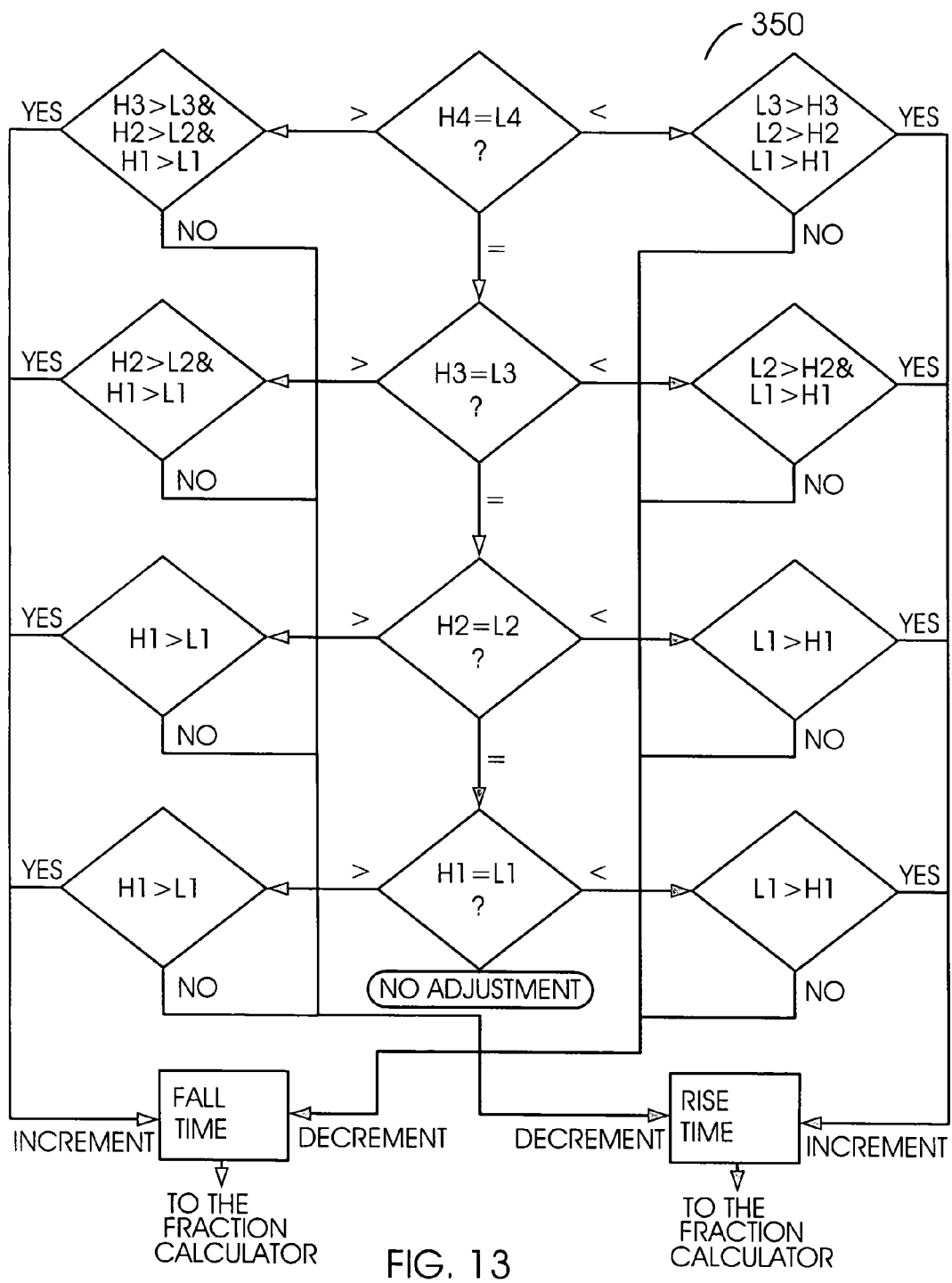
FIG. 13 is a flow diagram illustrating an example operation of a decision making logic block of FIG. 12.

Referring to FIG. 13, a flow diagram 350 illustrating an example operation of the decision making logic block of FIG. 12 is shown. The labels H1–H4 and L1–L4 represent the stored values in the blocks 186 and 188, respectively. The stored data is generally analyzed to determine whether each entry of the HIGH data table is equal to the corresponding entry of the LOW data table. When the HIGH and LOW data entries are equal for all entries, there is generally no need for any further correction. When the corresponding entries are not the same, corrective measures may be employed to adjust the incoming symbol data widths.

When the table entries are compared, the result of the comparison may be used to generate two related factors, a rise time (e.g., RTIME) and a fall time (e.g., FTIME). The factor FTIME is generally increased when all HIGH entries are larger than their respective entries in the LOW table. The factor RTIME is generally increased when all LOW entries are larger than their respective entries in the HIGH table.

The factor RTIME is generally decremented when the largest HIGH table entry is larger than the largest LOW table entry, but smaller HIGH table entries are smaller than their respective LOW table entries. The factor FTIME is generally decremented when the largest LOW table entry is larger than the largest HIGH table entry, but smaller LOW table entries are smaller than their respective HIGH table entries.

The values of rise time and fall time may be incremented and decremented as necessary. The values of rise time and fall time are generally not allowed to fall below a predetermined minimum value, simply because the result of a division by a very small number or 0 is generally too inaccurate to be used. For example, a minimum value of 5 may be used representing an amount of time of 5 PLL phases. When a PLL fundamental frequency of 100 MHz is selected, 5 PLL phases would represent a rise or fall time of 3.125 nS. When a fundamental frequency of 125 MHz is selected, 5 PLL phases represents 2.5 nS. When the result of an evaluation requires rise time or fall time to be decremented to less than 5, the other value is generally incremented instead (e.g., fall time may be incremented instead of decrementing rise time and vise versa). For the sake of clarity, the incrementing of one value instead of decrementing another value is not shown in the flowchart. When the result of the evaluation does not require any change to the rise and fall time values, the values are left unchanged. Whenever a change takes place, a period of inactivity is generally imposed on the evaluation process to allow the changes to take effect. The period of inactivity may be implemented, in one example, as 16 events of the signals H_STB and L_STB. In general, the whole process depends on the circuit 100 being in the locked condition.

When a change is made to either rise or fall time, the fractions R_FRAC and F_FRAC are generally re-evaluated and a period of inactivity is initiated. When the change to either rise or fall time is drastic, lock may be lost, imposing a further period of inactivity until lock is re-acquired. In general, the stored values adjust to the changes caused by the new values of R_FRAC and F_FRAC. The adjustment of the stored values may lead to a new cycle of adaptation to be initiated. The changes to the fractional values R_FRAC and F_FRAC are generally non-linear. A small change to rise time or fall time may result in a large change in the corrected symbol value. When a large change in the corrected symbol value occurs, lock may be lost.

Figure 14:
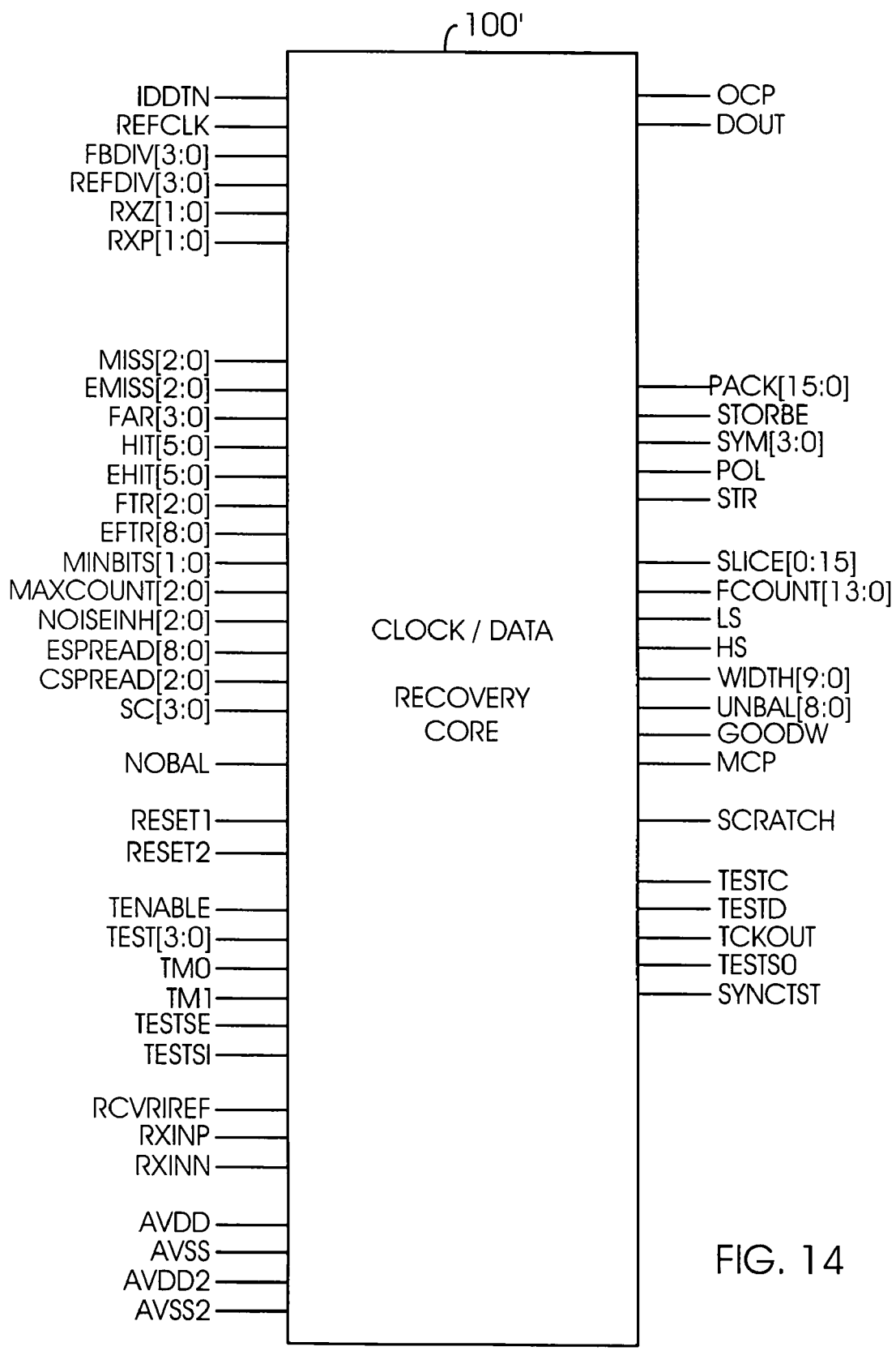
FIG. 14 is a block diagram illustrating an alternative implementation of the present invention.

Referring to FIG. 14, a block diagram illustrating an alternative implementation of the present invention is shown. The circuit 100' may be implemented, in one example, as a clock and data recovery core for serial data. In one example, the data rates may be up to 150 MBPS. The circuit 100' may have an analog section configured to (i) generate 16 clock phases at, for example, 125 megahertz and (ii) sample an incoming data stream every 500 ps. The samples of the incoming data stream may be converted into digital signals and then directed to a digital synchronizer circuit. The digital synchronizer circuit may perform a clock and data recovery function. The circuit 100' may have a number of inputs that may receive a number of signals and a number of outputs that may present a number of signals. Examples of the input signals and output signals of the circuit 100' may be summarized as in the following TABLE 2:

TABLE 2

| SIGNAL | TYPE | DESCRIPTION |
| --- | --- | --- |
| AVDD, AVSS | Power | Analog supplies for PLL, input bias circuit and capture flip-flops. |
| AVDD2, AVSS2 | Power | Analog supplies for remaining analog circuits. |
| DOUT | Output | Recovered data, retimed by OCP. |
| FAR[3:0] | Input | May define how much a score is decremented when a new symbol is too large. |
| FBDIV[3:0] | Input | PLL feedback divider. Allows the use of a wide range of reference frequencies (applied to REFCLK). |
| HIT[5:0] | Input | May define how much a score is incremented when a new symbol of the same size is recognized. |
| IDDTN | Input | IDD Test input (active low). Set IDDTN = 0 to power down the device. In normal operation, IDDTN = 1. |
| MAXCOUNT[2:0] | Input | Synchronizer state machine control. Controls the length of time before SCRATCH is asserted high when no transitions are detected on RXINP. This time is governed by the equation $t=128ns \cdot 2^{MAXCOUNT[2:0]}$. Set MAXCOUNT[2:0]=111 to disable this function and force SCRATCH=0. |
| MINBITS[1:0] | Input | Minimum data length. Tells the synchronizer what is the minimum number of sequential 0's or 1's in a valid data stream. For CD and DVD data streams this number is 3. Other applications may require a different setting.<br>minimum number of bits    MINBITS[1:0]<br>1    00<br>2    01<br>3    10<br>4    11. |
| MISS[2:0] | Input | May define how much a score is decremented when the new symbol data is not of similar size. |
| NOISEINH[2:0] | Input | Synchronizer state machine control. Prevents the synchronizer state machine from reacting to chaotic sampled data (i.e., a noisy sequence of zeros and ones) which can occur at the data transitions. For very high speed data, set to 000. For moderate or low-speed data, set to 101 and adjust up or down. |
| OCP | Output | Recovered clock. OCP may comprise a pulse 4ns wide. In the synchronizer's last stage in the data path, OCP may clock the recovered data into a D flip-flop. The DOUT pin may be connected to the output of this flip-flop. |
| RCVRIREF | Analog Input | Current Reference. A 100 $\mu$A current is applied INTO this pin. |
| REFCLK | Input | PLL reference clock input, When TM0=1, REFCLK is used to clock a test mode. When TM1=1, REFCLK clocks all the logic elements in the core, facilitating scan testing. |
| REFDIV[3:0] | Input | PLL reference divider. Allows the use of a wide range of reference clock frequencies (applied to REFCLK). |
| RESET1 | Input | System reset. Toggle high on power-up. |
| RESET2 | Input | Synchronizer reset. Toggle high when changing tracks on the media. |
| RXINN | Analog Input | Serial data input, negative. Bypassed off-chip to analog ground with 0.1 $\mu$F for single-ended inputs. |
| RXINP | Analog Input | Serial data input, positive. Connects to the input data signal through a series 0.01 $\mu$F blocking capacitor. |
| RXP[1:0] | Input | PLL pole adjustment. |
| RXZ[1:0] | Input | PLL zero adjustment. |
| SCRATCH | Output | Scratch detection. Goes high when the synchronizer has detected the absence of data transitions on RXINP. |

Test Pins

| SIGNAL | TYPE | DESCRIPTION |
| --- | --- | --- |
| SYNCTST | Output | Output may be used to observe the input signal to the phase detector of the 16-Phase PLL. When this PLL is in lock, the frequency of SYNCTST is given by $f_{SYNCTST} = \frac{1}{2} * f_{REFCLK}/REFDIV$. |
| TCKOUT | Output | This clock output is used to observe a special factor test mode when TM0=1. |
| TEST[3:0] | Input | Test mux selection. Selects which of 16 clock and data phases connects to the TESTC and TESTD outputs. |
| TESTC | Output | PLL clock output. TEST[3:0] selects which PLL phase is connected to this output. |
| TESTD | Output | Sampled data output. TEST[3:0] sets which capture flip-flop output connects to this pin. |
| TENABLE | Input | Set TENABLE=1 to enable the TESTC and TESTD outputs. Set TENABLE=0 during normal operation. |
| TESTSI | Input | Scan input. |
| TESTO | Output | Scan output. |
| TESTSE | Input | Scan enable. Connect to chip-level scan enable. |
| TM0, TM1 | Input | Test Mode 0 and Test Mode 1. Controls a special test modes used for synchronizer debug.<br>TM0    TM1<br>0    0    Normal operation.<br>1    0    Test phase generator. Driven by the PLL reference clock. |

TABLE 2-continued

| SIGNAL | TYPE | DESCRIPTION |
|---|---|---|
| | | 0   1   Apply PLL reference to all digital logic. |
| | | 1   1   Test phase generator is active. |
| | | Internally generating test data is used. |
| EHIT[5:0], | Input | EHIT may define how much an error score is incremented when a new symbol |
| EMISS[2:0] | | should be in the table (e.g., the new symbol is smaller than the |
| | | largest table entry) . EMISS may define how much the error score is |
| | | decremented when a new symbol should be in the table (e.g., the new symbol is |
| | | smaller than the largest table entry). |
| SC[3:0] | Input | These inputs inhibit internal score registers so |
| | | that they do not affect the lock detection logic. |
| ESPREAD[8:0] | Input | This input value may control the limit of deviation of an input |
| | | data symbol before the symbol is no longer recognized as legal data. |
| CSPREAD[2:0] | Input | This input may control the use of the internally |
| | | calculated SPREAD value or select the ESPREAD value. |
| SLICE[0:15] | Output | The outputs of the data samplers. |
| FCOUNT[3:0] | Input | The detected width of the current input data. |
| LS, HS | | Strobes that may indicate that FCOUNT represents Low or High data. |
| WIDTH[9:0] | | Indicates width of one bit of data. |
| NOBAL | | Disables the use of UNBAL within the logic. |
| UNBAL[8:0] | | Indicates difference between high and low data. |
| GOODW | | Data locked flag. |
| MCP | Output | Main processing clock output. The clock may be used by the system logic. |
| DOUT | Output | Serial output data. |
| OCP | Output | Output clock which drives DOUT. |
| PACK[15:0] | Output | Parallel output data, 16 bits at a time. |
| STROBE | Output | Indicates that new data is available on PACK. |
| SYM[3:0] | Output | Symbol data. This output indicates the width in bits of the current symbol. |
| POL | Output | The polarity of the current symbol (high or low data). |
| STR | Output | A strobe signal indicating new data on SYM. |

Figure 15:
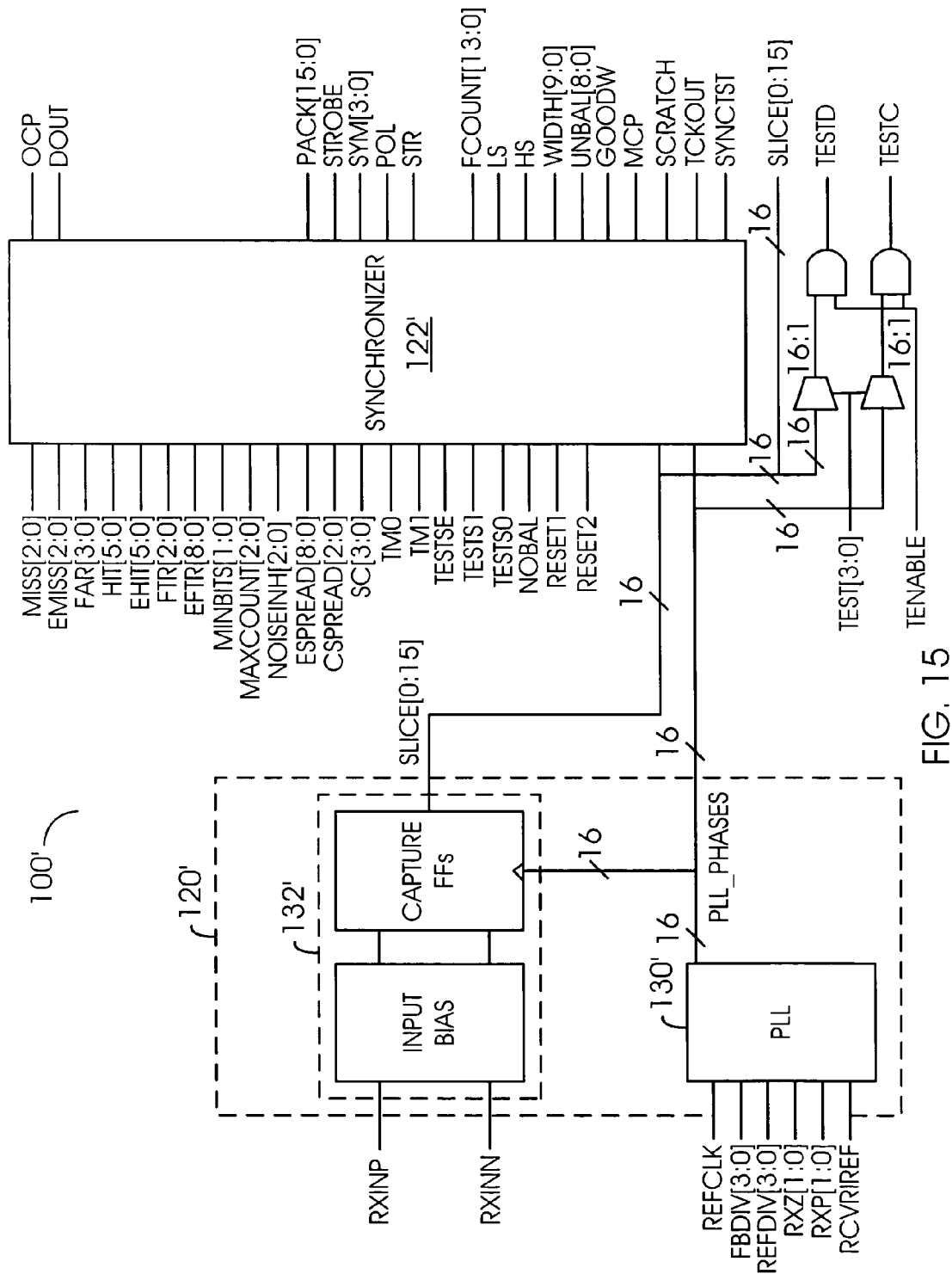
FIG. 15 is a more detailed block diagram of the alternative implementation of FIG. 14.

Referring to FIG. 15, a more detailed block diagram of the circuit 100' is shown. The circuit 100' may be implemented similarly to the circuit 100, except that the circuit 132 may comprise an input bias circuit and a number of flip-flops for capturing samples of the incoming data stream. The circuit 130' may be implemented as a 16-phase phase lock loop circuit. The circuit 130' may have a number of inputs that may receive the signals REFCLK, FBDIV[3:0], REFDIV[3:0], RXZ[1:0], RXP[1:Z] and RCVRIREF. The circuit 122' may be configured to receive a number of external signals for configuring internal parameters (described above in connection with FIGS. 6, 8, 10, and 11). The output of the sampler circuit 120' (e.g., the signal SLICE) may be presented to a multiplexer. In one example, the multiplexer may be implemented as a 16:1 multiplexer circuit. The multiplexer may be configured to present one of the number of samples of the signal SLICE selected in response to an input signal (e.g., the signal TEST[3:0]) as the output signal TESTD. In one example, the multiplexer may be implemented as 16:1 multiplexer circuit. The signal PLL_PHASES may be presented to a multiplexer. The multiplexer may be configured to present one of the phases of the signal PLL_PHASES selected in response to the signal TEST[3:0] as the signal TESTC. The circuit 100' is shown having a number of outputs. The number of outputs may be varied to meet the design criteria of a particular application.

Figure 16:
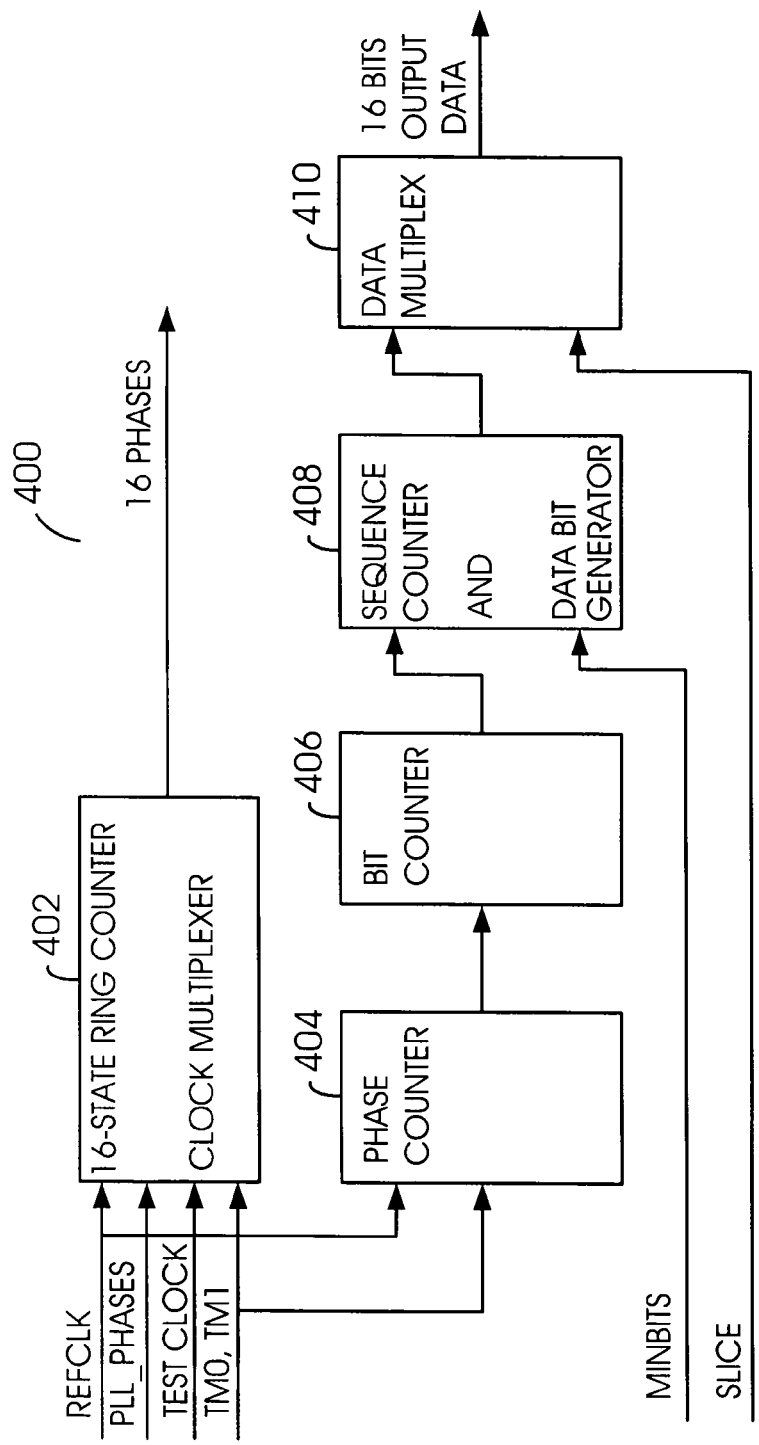
FIG. 16 is a block diagram of a test circuit implemented in accordance with the present invention.

Referring to FIG. 16, a block diagram of a circuit 400 illustrating an implementation of a test circuit in accordance with the present invention. The circuit 400 may be implemented internally to the circuits 100 or 100'. The circuit 400 may comprise a circuit 402, a circuit 404, a circuit 406, a circuit 408, and a circuit 410. The circuit 402 may be implemented as a ring counter circuit. In one example, the circuit 402 may be implemented with 8-stages. The circuit 404 may be implemented as a phase counter circuit. The circuit 406 may be implemented as a bit counter circuit. The circuit 408 may be implemented as a bit counter and data bit generator circuit. The circuit 410 may be implemented as a multiplexer circuit.

The test phases may be generated directly from the ring counter 402. The ring counter 402 generally does not require any decoding to be done, thus simplifying the design and avoiding glitches often associated with decoders. The phases generated by the circuit 402 may be multiplexed onto a number of outputs(e.g., 16) in response to the signals TM0 and TM1, described above. In a test mode, the reference clock may be multiplexed onto all of the outputs at the same time. The test mode may be used for scan testing where it is essential that a single clock be used to drive all flip-flops in the design.

The test data generator 408 may be configured to generate a single test data output signal. The test data signal may be multiplexed onto all the bits (e.g., 16) of a sampled data output. The bit counter 406 may be configured to control the point in time when the test data is changed. The test data may be generated, in one example, at 13 phases per bit. Dependent on the setting of MINBITS, the range of the bit counter 406 may be adjusted for the ranges in the following TABLE 3:

TABLE 3

| MINBITS | | Sequence Range |
|---|---|---|
| 0 | 0 | 1–5 |
| 0 | 1 | 2–6 |
| 1 | 0 | 3–7 |
| 1 | 1 | 4–8 |

Figure 17:
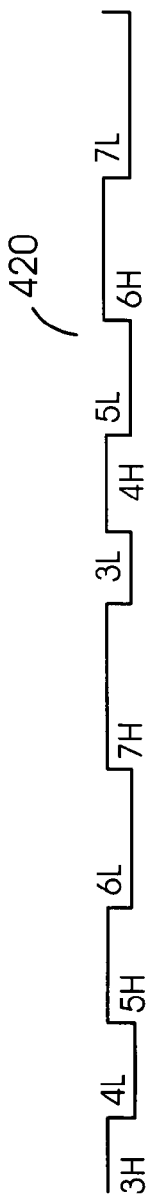
FIG. 17 is a timing diagram illustrating an example test bit sequence.

Referring to FIG. 17, a timing diagram 420 illustrating an example test sequence is shown. For each setting of MINBITS, each possible number of bits may be generated in sequence. For example, when MINBITS is set to "10," the sequence of FIG. 17 may be repeated with 13 test phases per bit. At the end of each count, the output data polarity is generally inverted. Since there are 5 possible data lengths or each setting of MINBITS, after 10 counts, each possible data length and polarity generally has been generated. The values may be stored in the HIGH and LOW data width tables, compared, and the bit width extracted and so on. When the values of HIT, MISS and FAR permit, lock may be achieved in a clean environment (e.g., without the influence of noise or rise and fall times). Values may be provided for each table entry. Larger values may be provided also to examine the effects of wider symbols. Although the distribution of values is generally not identical to real data, the distribution may be close enough to serve as a test. The test logic may be expanded to include the possible effects of rise and fall timing, and even introduce some extra switching at each data edge. In one example, the testing described above may be done by the test bench used to simulate the design.

The test data may be generated internally and inserted instead of the normal data stream. The test phase generator may provide 16 phases from a special counter rather than from the PLL. The PLL reference clock REFCLK may be used as a test clock to drive both the test phase generator and the test data generator. The circuit 400 may provide the following advantages:

1). Although the PLL is decoupled from the digital logic in test, alternative data sources and clocks are provided by a form of built in self test.

2). By using these built in functions, functionality of the design may be verified without physically removing the device from the end user's apparatus.

3) By using these built in functions, the applied parameters, HIT, MISS, EHIT, EMISS and FAR, may be verified to indeed lead to proper operation of the design. For example, when the value of MISS is set to 20 and the value of HIT is set to 10, lock will generally not be achieved because each hit will cause the neighboring scores to be decremented by such a large amount that the lower threshold value for lock will not be reached.

4) Provision of these built in functions may relieve the requirement for extensive external test equipment to generate a suitable input data signal for test purposes.

The functions performed by the diagrams of FIGS. 6, 8, 10, 11, 12, and 16 may be implemented using a conventional general purpose digital computer programmed according to the teachings of the present specification, as will be apparent to those skilled in the relevant art(s). Appropriate software coding including, but not limited to, hardware description language coding (e.g., RTL, VHDL, etc.) can readily be prepared by skilled programmers based on the teachings of the present disclosure, as will also be apparent to those skilled in the relevant art(s).

The present invention may also be implemented by the preparation of ASICs, FPGAs, or by interconnecting an appropriate network of conventional component circuits, as is described herein, modifications of which will be readily apparent to those skilled in the art(s).

The present invention thus may also include a computer product which may be a storage medium including instructions which can be used to program a computer to perform a process in accordance with the present invention. The storage medium can include, but is not limited to, any type of disk including floppy disk, optical disk, CD-ROM, and magneto-optical disks, ROMs, RAMs, EPROMS, EEPROMs, Flash memory, magnetic or optical cards, or any type of media suitable for storing electronic instructions.

The various signals of the present invention are generally "on" (e.g., a digital HIGH, or 1) or "off" (e.g., a digital LOW, or 0). However, the particular polarities of the on (e.g., asserted) and off (e.g., de-asserted) states of the signals may be adjusted (e.g., reversed) accordingly to meet the design criteria of a particular implementation.

While the invention has been particularly shown and described with reference to the preferred embodiments thereof, it will be understood by those skilled in the art that various changes in form and details may be made without departing from the spirit and scope of the invention.

What is claimed is:

1. An apparatus comprising:
    an analog circuit configured to generate a plurality of samples of an input signal in response to a plurality of phases of a reference clock; and
    a digital circuit configured to generate an output signal and a clock signal in response to said plurality of samples and said plurality of phases, wherein (a) said clock signal is aligned with said output signal and (b) said digital circuit comprises a synchronization circuit comprising (i) a first stage configured to generate a first intermediate output in response to said plurality of samples and said plurality of phases, (ii) a second stage configured to generate a second intermediate output in response to a first portion of said first intermediate output and one of said plurality of phases and (iii) a third stage configured to generate a plurality of synchronized data signals in response to a second portion of said first intermediate output and said second intermediate output in response to a second one of said plurality of phases.

2. The apparatus according to claim 1, wherein said analog circuit comprises:
    a plurality of comparators, each configured to generate a logic level output in response to a reference signal and one of said plurality of samples of said input signal; and
    a plurality of pass gates, each configured to present said one of said plurality of samples of said input signal in response to one of said plurality of phases of said reference clock.

3. The apparatus according to claim 1, wherein said analog circuit comprises a multi-phase phase locked loop circuit configured to generate said plurality of phases.

4. The apparatus according to claim 1, wherein said clock signal is aligned with a predetermined point of a bit time of said output signal.

5. The apparatus according to claim 1, wherein said clock signal is aligned with a center of a bit time of said output signal.

6. The apparatus according to claim 1, wherein said digital circuit comprises one or more output circuits selected from the group consisting of (i) a serial output circuit configured to generate a serial data signal and a serial clock signal, (ii) a packed data output circuit configured to generate a packed data signal and a first strobe signal, and (iii) a symbol data output circuit configured to generate a symbol data signal, a polarity signal and a second strobe signal.

7. The apparatus according to claim 6, wherein said serial output circuit comprises a first-in-first-out (FIFO) memory having no resynchronization logic.

8. The apparatus according to claim 1, wherein said digital circuit is configured to align said clock signal by selecting one of said plurality of phases in response to a first accumulated value.

9. The apparatus according to claim 8, wherein said digital circuit is configured to increment said first accumulated value by a calculated bit width each time a phase is selected.

10. The apparatus according to claim 8, wherein said digital circuit is configured to align said clock signal by selecting another one of said plurality of phases in response to a second accumulated value.

11. The apparatus according to claim 10, wherein said digital circuit is configured to increment said first and second accumulated values by a calculated bit width each time a phase is selected.

12. The apparatus according to claim 10, wherein said digital circuit is configured to generate said clock signal having two edges within a period of a predetermined one of said plurality of phases.

13. The apparatus according to claim 8, wherein said digital circuit is configured to determine a period of said clock signal based on a calculated bit width.

14. The apparatus according to claim 1, wherein said output signal comprises one or more signals selected from the group consisting of a serial data signal, a packed data signal, a symbol data signal, a polarity signal and a strobe signal.

15. A method for extracting data information from an input signal comprising the steps of:
(A) receiving said input signal;
(B) generating a plurality of samples of said input signal in response to a plurality of phases of a reference clock;
(C) generating an output signal and a clock signal in response to said plurality of samples, a reference signal and said plurality of phases, wherein said clock signal is aligned with said output signal;
(D) generating a first intermediate output in response to said plurality of samples and said plurality of phases;
(E) generating a second intermediate output in response to a first portion of said first intermediate output and one of said plurality of phases; and
(F) generating a plurality of synchronized data signals in response to a second portion of said first intermediate output and said second intermediate output in response to a second one of said plurality of phases.

16. The method according to claim 15, wherein step (B) comprises the sub-step of:
sampling said input signal with a plurality of sample and hold gates controlled by said plurality of phases of said reference clock to generate said plurality of samples.

17. The method according to claim 16, wherein step (C) further comprises the sub-step of:
selecting one of said plurality of phases as said clock signal in response to a first accumulated value.

18. The method according to claim 17, wherein step (C) further comprises the sub-step of:
selecting another of said plurality of phases as said clock signal in response to a second accumulated value.

19. The method according to claim 18, wherein step (C) further comprises the sub-steps of:
decrementing said first and said second accumulated values by the number of phases in said plurality of phases; and
incrementing said first and said second accumulated values by a calculated bit width.

20. An apparatus comprising:
an analog circuit configured to generate a plurality of samples of an input signal in response to a plurality of phases of a reference clock; and
a digital circuit configured to generate an output signal and a clock signal in response to said plurality of samples and said plurality of phases, wherein (a) said clock signal is aligned with said output signal and (b) said digital circuit comprises (i) a synchronization circuit configured to generate a plurality of synchronized data signals in response to said plurality of samples of said input signal and said plurality of phases of said reference clock and (ii) a symbol width determining circuit configured to generate a first strobe signal, a second strobe signal, a high data signal, a low data signal and a calculated bit width signal in response to said plurality of synchronized data signals.

21. The apparatus according to claim 20, wherein said symbol width determining circuit comprises:
a data width counter configured to generate said first strobe signal, said second strobe signal and a data width signal in response to said plurality of synchronized data signals;
a symbol width correction logic configured to generate said high data signal and said low data signal in response to said data width signal, a width comparison signal and a lock detection signal;
a width comparison circuit configured to generate said width comparison signal, a high bit signal and a low bit signal in response to a first table value selected in response to said first strobe signal and said high data signal and a second table value selected in response to said second strobe signal and said low data signal; and
a bit width calculation circuit configured to generate said lock detection signal and said calculated bit width signal in response to said high bit signal and said low bit signal.

* * * * *